(12) United States Patent
Chen

(10) Patent No.: US 10,873,484 B2
(45) Date of Patent: Dec. 22, 2020

(54) DEVICE WITH EQUALER CIRCUIT

(71) Applicant: TAIWAN SEMICONDUCTOR MANUFACTURING CO., LTD., Hsinchu (TW)

(72) Inventor: Wei-Chih Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/746,722

(22) Filed: Jan. 17, 2020

(65) Prior Publication Data

US 2020/0244493 A1 Jul. 30, 2020

Related U.S. Application Data

(60) Provisional application No. 62/797,939, filed on Jan. 28, 2019.

(51) Int. Cl.
*H04L 25/03* (2006.01)
*H03M 1/66* (2006.01)
*H03F 3/45* (2006.01)

(52) U.S. Cl.
CPC ... *H04L 25/03885* (2013.01); *H03F 3/45071* (2013.01); *H03M 1/66* (2013.01); *H04L 25/03057* (2013.01)

(58) Field of Classification Search
CPC ......... H04L 25/03006; H04L 25/03828; H04L 25/03878; H04L 25/03885; H04L 25/03057; H03F 3/45071; H03M 1/66
See application file for complete search history.

(56) References Cited

U.S. PATENT DOCUMENTS

| | | | |
|---|---|---|---|
| 9,379,920 B1* | 6/2016 | Liao | H04L 25/03878 |
| 9,900,121 B1* | 2/2018 | Takatori | H04L 25/03057 |
| 2013/0169314 A1* | 7/2013 | Choudhary | H04L 25/03057 327/91 |
| 2014/0281845 A1* | 9/2014 | Cyrusian | G06F 11/08 714/819 |
| 2016/0373241 A1* | 12/2016 | Jin | H04L 7/033 |

* cited by examiner

*Primary Examiner* — Siu M Lee
(74) *Attorney, Agent, or Firm* — Maschoff Brennan

(57) ABSTRACT

An integrated circuit is disclosed. The integrated circuit includes a first equalizer circuit and a second equalizer circuit. The first equalizer circuit is configured to equalize an input signal which is added by offset voltages that are different from each other, to generate output signals with voltage levels that are different from each other. The second equalizer circuit coupled to the first equalizer circuit. The second equalizer circuit includes a first equalizer unit and a second equalizer unit. The first equalizer unit is configured to equalize the output signals, to generate odd data signals. The second equalizer unit is coupled to the first equalizer unit and configured to equalize the output signals, to generate even data signals. A method is also disclosed herein.

20 Claims, 10 Drawing Sheets

DEVICE WITH EQUALER CIRCUIT

RELATED APPLICATIONS

This application claims priority to U.S. Provisional Application Ser. No. 62/797,939, filed Jan. 28, 2019, which is herein incorporated by reference.

BACKGROUND

Programmable integrated circuits (ICs) are usually provided to receive and/or transmit a high-speed digital data stream from along a data channel. At the end of a long serial data communication, such as in systems with serializer/deserializer ("SERDES") receivers, an incoming waveform may not look like the waveform that was sent from a data transmitting device. To compensate for these changes in the incoming waveform, equalization is normally applied to correct the received signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
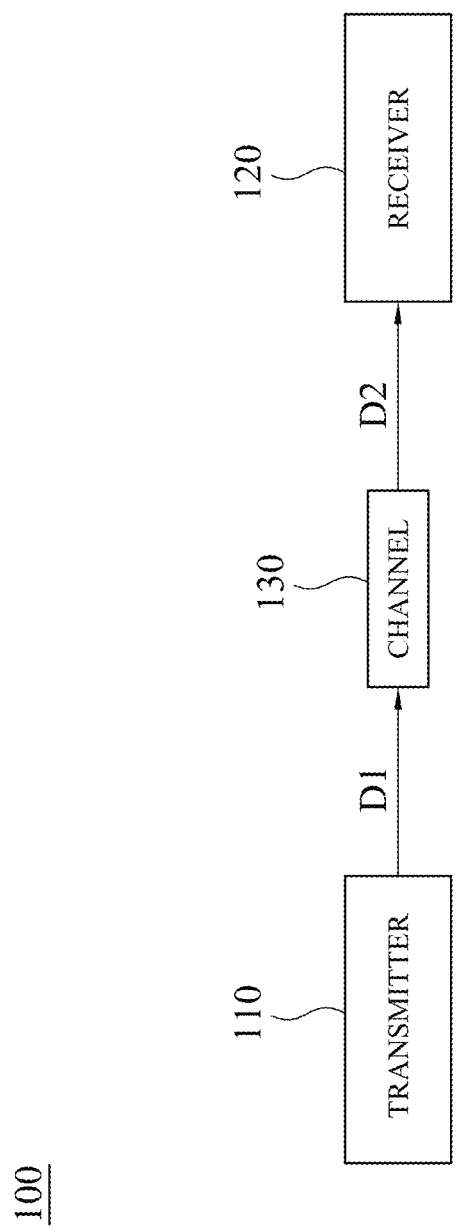
FIG. 1 is a schematic diagram of a communication system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

FIG. 1 is a schematic of a communication system 100, according to some embodiments of the present disclosure. In some embodiments, the communication system 100 is implemented by a serializer/de-serializer (SerDes) system. Various systems which require implementation of the communication system 100 are within the contemplated scope of the present disclosure.

For illustration in FIG. 1, the communication system 100 includes a transmitter 110, a receiver 120, and a channel 130 which is coupled between the transmitter 110 and the receiver 120.

In some embodiments, the transmitter 110 is implemented by an integrated circuit (IC) arranged in a device. The receiver 120 is also implemented by an IC arranged in another device different from where the transmitter 110 is arranged. In various embodiments, the transmitter 110 and the receiver 120 are implemented by the same IC. In some embodiments, the channel 130 is implemented by a physical transmission line. In various embodiments, the channel 130 is implemented by medium, including at least one of air, water or metal, with or without physical structure for transmitting signal to the receiver 120.

For illustration in FIG. 1, when the communication system 100 operates, the transmitter 110 outputs a signal D1, and the signal D1 is transmitted to the channel 130. After transmission, a signal D2 is outputted from the channel 130 and received by the receiver 120.

In some embodiments, the power of the signal D2 is less than the power of the signal D1, which results from the loss of the channel 130 and is caused by the limited channel bandwidth. The channel bandwidth may be limited and reduced by several effects including, for example, skin effect, dielectric loss and impedance discontinuities between any two of material with different dielectric or size. The limited channel bandwidth may cause the signal delay in the following transmission. The delayed signal may overlap with the subsequent signal, which leads to the inter-symbol interference (ISI).

In some embodiments, the signal D1 and the signal D2 are each implemented by a 2-level pulse-amplitude modulation (PAM-2) signal with one bit for each symbol. In some other embodiments, the signal D1 and the signal D2 are each implemented by a 4-level pulse-amplitude modulation (PAM-4) signal with two bits for each symbol, in order to have high signal transmission speed. If one symbol of the PAM-4 signals delays, two bits of such symbol may be error resulted from the ISI. In order to eliminate the ISI of the signal D2, and to reduce the difference between the signal D2 and the signal D1, equalization circuits are included in the receiver 120, which will be discussed below with reference to FIG. 2.

Figure 2:
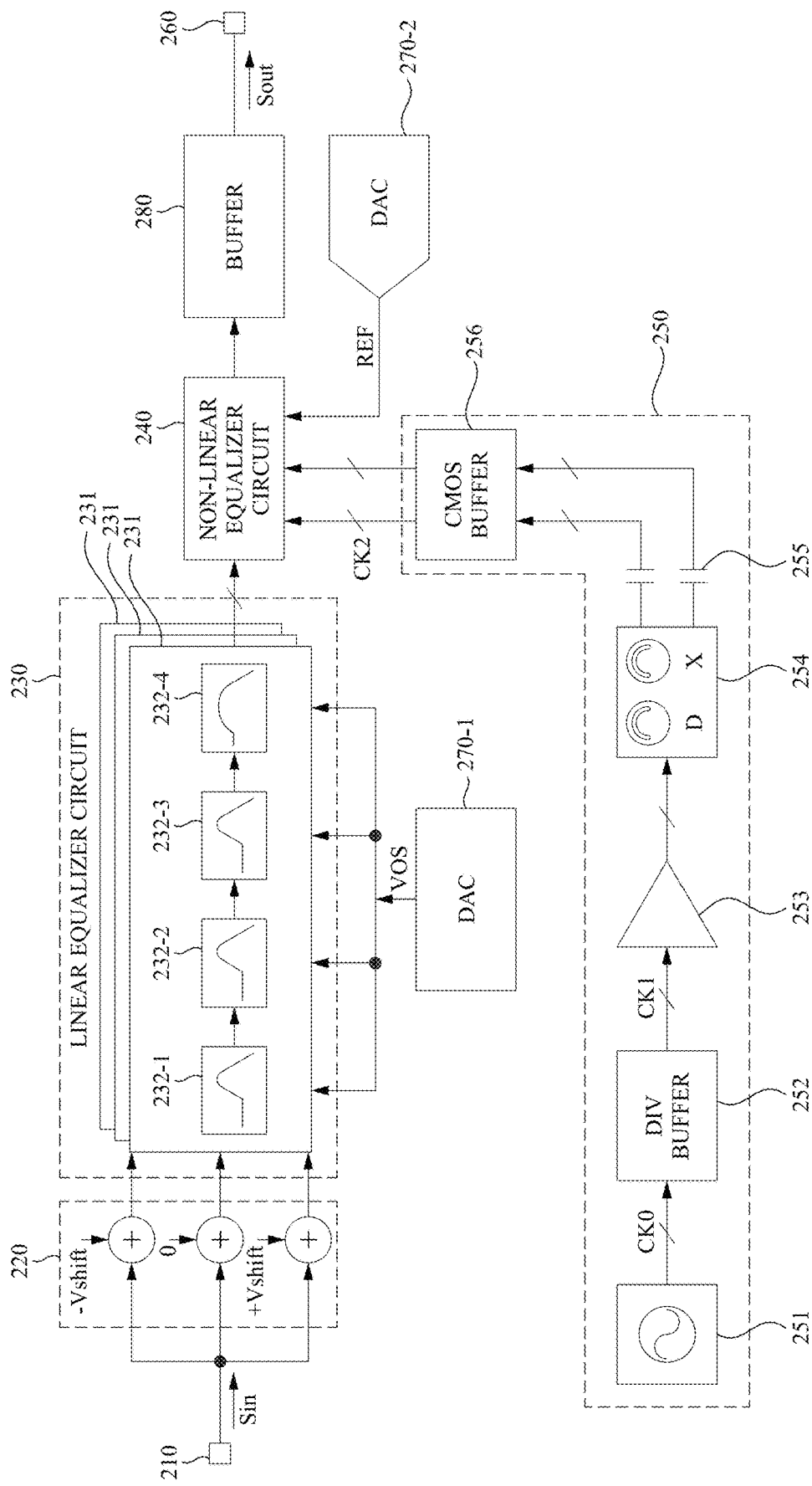
FIG. 2 is a schematic diagram of a receiver associated with the receiver shown in FIG. 1, in accordance with some embodiments of the present disclosure.

FIG. 2 is a schematic diagram of a receiver 200 associated with the receiver 120 shown in FIG. 1, in accordance with some embodiments of the present disclosure.

For illustration in FIG. 2, the receiver 200 includes an input terminal 210, a voltage shifting amplifier circuit 220, a linear equalizer circuit 230, a non-linear equalizer circuit 240, a clock signal generator circuit 250, and an output terminal 260. The input terminal 210 is sequentially followed by the voltage shifting amplifier circuit 220, the linear equalizer circuit 230, the non-linear equalizer circuit 240 which is connected to the clock signal generator circuit 250, and the output terminal 260.

Figure 3:
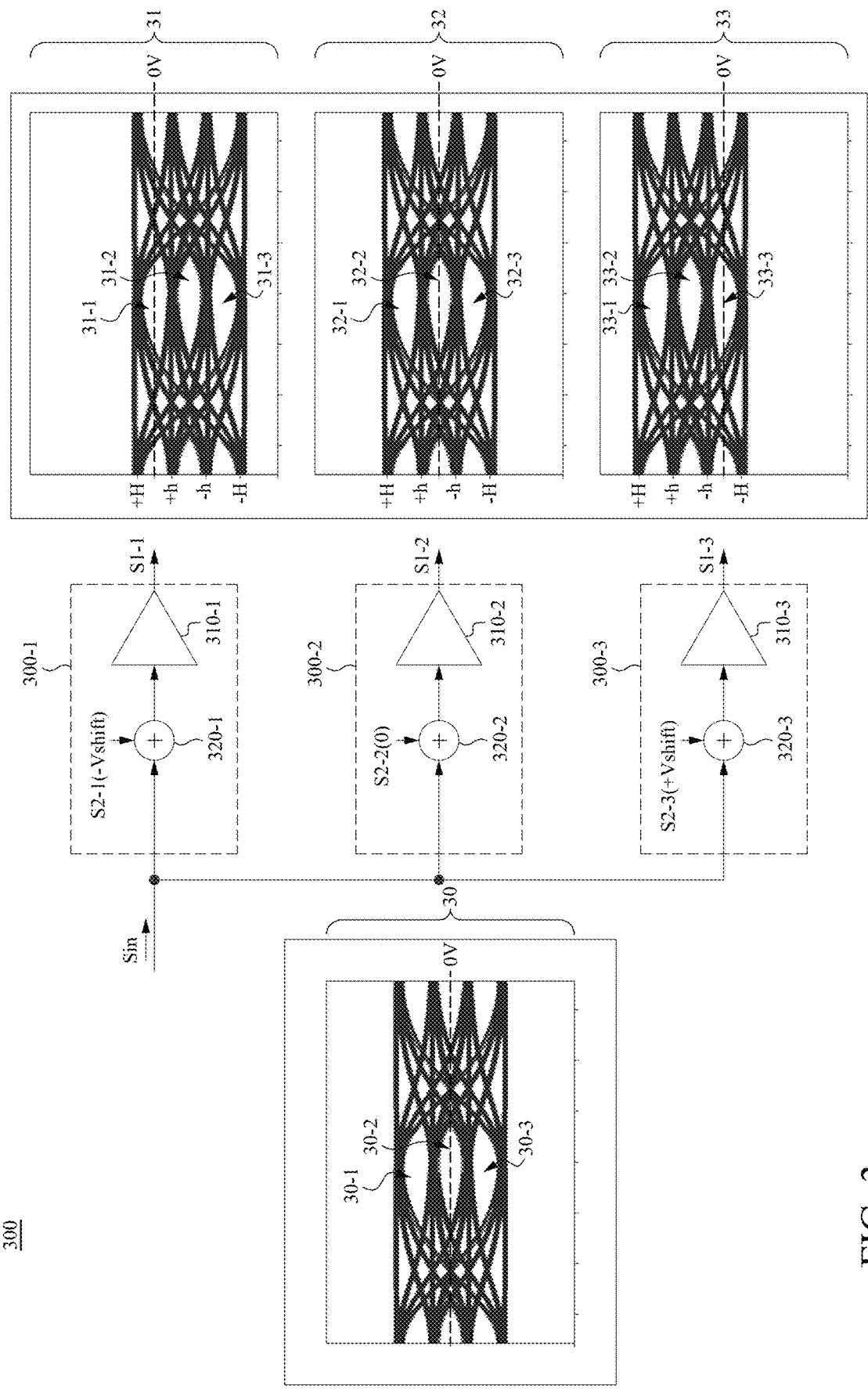
FIG. 3 is a schematic diagram of a circuit corresponding to the voltage shifting amplifier circuits shown in FIG. 2, in accordance with some embodiments of the present disclosure.

The input terminals of the voltage shifting amplifier circuit 220 are connected to the input terminal 210, and the output terminals of the voltage shifting amplifier circuit 220 are connected to the input terminals of the linear equalizer circuit 230. In some embodiments, the voltage shifting amplifier circuit 220 is configured to receive an input signal Sin, configured to shift the input signal Sin by different voltages and configured to generate signals (which is shown in FIG. 3) corresponding to these different voltages. In some embodiments, the input signal Sin corresponds to the signal D2 as illustrated in FIG. 1. In some embodiments, the input signal Sin is implemented by a PAM-4 signal with high bit rate, such as 56 Giga bit per second (Gps).

The input terminals of the linear equalizer circuit 230 are connected to the output terminals of the voltage shifting amplifier circuit 220, and the output terminals of the linear equalizer circuit 230 are connected to the input terminals of the non-linear equalizer circuit 240. In some embodiments, the linear equalizer circuit 230 is configured to receive signals outputted from the voltage shifting amplifier circuit 220, and configured to linearly equalize the signals corresponding to different voltages and generate linearly equalized signals (not shown) corresponding to different voltages.

The input terminals of the non-linear equalizer circuit 240 are connected to the output terminals of the linear equalizer circuit 230 and the output terminals of the clock signal generator circuit 250, and the output terminal of the non-linear equalizer circuit 240 is connected to the output terminal 260. In some embodiments, the non-linear equalizer circuit 240 is configured to receive signals outputted from the linear equalizer circuit 230, and configured to non-linearly equalize the signals and generate the non-linearly equalized signals (not shown).

The output terminals of the clock signal generator circuit 250 are connected to the input terminals of the non-linear equalizer circuit 240. In some embodiments, the clock signal generator circuit 250 is configured to generate and provide clock signals CK2 to the non-linear equalizer circuit 240. In some embodiments, the clock signals CK2 are implemented by differential clock signals with low frequency of, for example, 14 GHz.

In some embodiments, the input terminal 210 and the output terminal 260 are implemented by antennas for receiving or transmitting corresponding signals. In alternative embodiments, the input terminal 210 and the output terminal 260 are implemented by metal lines.

In various embodiments with respect to FIG. 2, the receiver 200 further includes a digital-to-analog converter (DAC) 270-1, a DAC 270-2 and a buffer 280.

The output terminals of the DAC 270-1 are connected to the input terminals of the linear equalizer circuit 230. In some embodiments, the DAC 270-1 is configured to provide control signals VOS to the linear equalizer circuit 230, which will be discussed below in more detail.

The output terminals of the DAC 270-2 are connected to the input terminals of the non-linear equalizer circuit 240. In some embodiments, the DAC 270-2 is configured to provide control signals REF to the non-linear equalizer circuit 240, which will be discussed below in more detail.

The input terminal of the buffer 280 is connected to the output terminal of the non-linear equalizer circuit 240, and the output terminal of the buffer 280 is connected to the output terminal 260. In some embodiments, the buffer 280 is configured to amplify signal outputted from the non-linear equalizer circuit 240, and configured to provide the amplified signal (also noted as the output signal Sout) to the output terminal 260. In some embodiments, the output signal Sout is implemented by a PAM-4 signal with high bit rate, such as 56 Giga bit per second (Gps).

The configuration of the receiver 200 shown in FIG. 2 is given for illustrative purposes. Various configurations of the receiver 200 are within the contemplated scope of the present disclosure. For example, in various embodiments, the voltage shifting amplifier circuit 220 is included in the linear equalizer circuit 230. In alternative embodiments, the voltage shifting amplifier circuit 220 and the DAC 270-1 are both integrated with the linear equalizer circuit 230. In various embodiments, the clock signal generator circuit 250, the DAC 270-1, and the DAC-2 are integrated together.

The voltage shifting amplifier circuit 220 is connected in series between the input terminal 210 and the linear equalizer circuit 230. In some embodiments, the voltage shifting amplifier circuit 220 is configured to generate various offset voltages, configured to add these offset voltages to the input signal Sin, and configured to generate output signals (not shown) with different voltage levels corresponding to these corresponding offset voltages.

For example, as illustrated in FIG. 2, the voltage shifting amplifier circuit 220 is configured to receive and shift the input signal Sin by a negative offset voltage noted as "−Vshift" and generate an output signal with negative voltage level. The voltage shifting amplifier circuit 220 is also configured to receive and shift the input signal Sin by a zero offset voltage noted as "0" and generate an output signal with zero voltage level. The voltage shifting amplifier circuit 220 is also configured to receive and shift the input signal Sin by a positive offset voltage noted as "+Vshift" and generate an output signal with positive voltage level.

The configuration of the voltage shifting amplifier circuit 220 or the offset voltages therein shown in FIG. 2 are given for illustrative purposes. Various configurations of the voltage shifting amplifier circuit 220 or the offset voltages therein in FIG. 2 are within the contemplated scope of the present disclosure. For example, the voltage shifting amplifier circuit 220 is further configured to receive and shift the input signal Sin by one or more offset voltages in addition to the above offset voltages.

The linear equalizer circuit 230 is connected to the voltage shifting amplifier circuit 220, the DAC 270-1, and the non-linear equalizer circuit 240. The linear equalizer circuit 230 is configured to linearly equalize the signals outputted from the voltage shifting amplifier circuit 220. In some embodiments, the linear equalizer circuit 230 is implemented by a continuous time linear equalizer (CTLE) circuit.

In some embodiments, the linear equalizer circuit 230 includes a plurality of linear equalizer units 231. The linear equalizer units 231 are connected in parallel, and are connected to the output terminals of the voltage shifting amplifier circuit 220, respectively, for linearly equalizing signals with different voltage levels outputted from the corresponding voltage shifting amplifier circuit 220. For simplicity of illustration, the linear equalizer units 231 are shown by three overlapping blocks in FIG. 2.

In some embodiments, each of the linear equalizer units 231 includes a plurality of sub-units 232-1, 232-2, . . . , 232-4 connected in series, as shown in FIG. 2. For simplicity, each one of the sub-units 232-1, 232-2, . . . , 232-4 is referenced as 232 hereinafter for illustration, because each one of the sub-units 232-1, 232-2, . . . , 232-4 operates in a similar way in some embodiments.

Each of the sub-units 232 has a corresponding response frequency, and is configured to perform linear equalization in various spectral portion of signals outputted from the voltage shifting amplifier circuit 220 or outputted from the corresponding previous sub-units 232, and configured to generate the linearly equalized signal corresponding to the response frequency.

For example, as illustrated in FIG. 2, for one of the linear equalizer units 231, the sub-unit 232-1 receives the signal with positive voltage level outputted from the voltage shifting amplifier circuit 220, and also receives one of the control signals VOS from the DAC 270-1. Accordingly, the sub-unit 232-1 equalizes the received signal linearly in response to both of the control signal VOS and a high response frequency, and generates the linearly equalized signal with flatten spectral portion corresponding to the high response frequency.

Similarly, the sub-unit 232-2 receives the signal outputted from the sub-unit 232-1, and also receives one of the control signals VOS from the DAC 270-1. The sub-unit 232-2 equalizes the signal linearly in response to both of the control signal VOS and a sub-high response frequency, and generates the linearly equalized signal with flatten spectral portion corresponding to the sub-high response frequency.

Similarly, the sub-unit 232-3 equalizes the signal linearly in response to both of the control signal VOS and a middle response frequency, and the sub-unit 232-4 equalizes the signal linearly in response to both of the control signal VOS and a low response frequency.

The above number and arrangement of the sub-units 232 shown in FIG. 2 are given for illustrative purposes. Various numbers and arrangements of circuits to implement the sub-units 232 in FIG. 2 are within the contemplated scope of the present disclosure. For example, in various embodiments, the sub-unit 232-2 is omitted in one of the linear equalizer units 231.

The clock signal generator circuit 250 is connected to the non-linear equalizer circuit 240, and is configured to provide the clock signals CK2 to the non-linear equalizer circuit 240. In some embodiments, the clock signal generator circuit 250 is implemented by a clock data recovery (CDR) circuit. Various circuits which require implementation of the clock signal generator circuit 250 are within the contemplated scope of the present disclosure.

For illustration in FIG. 2, the clock signal generator circuit 250 includes a phase locked loop (PLL) circuit 251, a divider buffer (DIV buffer) 252, a buffer 253, a phase interpolator (PI) 254, capacitors 255, and a complementary metal-oxide-semiconductor buffer (CMOS buffer) 256, which are connected one-by-one sequentially.

The output terminal of the PLL circuit 251 is connected to the input terminal of the DIV buffer 252. The output terminal of the DIV buffer 252 is connected to the input terminal of the buffer 253. The output terminal of the buffer 253 is connected to the input terminal of the PI 254. The output terminal of the PI 254 is connected to the input terminal of the capacitors 255. The output terminal of the capacitors 255 is connected to the input terminal of the CMOS buffer 256. The output terminal of the CMOS buffer 256 is connected to the input terminal of the non-linear equalizer circuit 240.

In some embodiments, the PLL circuit 251 is configured to generate an initial clock signal CK0 with an initial frequency. The DIV buffer 252 is configured to divide the initial frequency of the initial clock signal CK0 by, for example, 2, configured to generate first clock signals CK1 with the divided frequency. The buffer 253 is configured to amplify the first clock signals CK1. The PI 254 is configured to shift phases of the amplified first clock signals CK1 within fixed phase differences. The capacitors 255 are configured to filter direct current (DC) of the signals outputted from the PI 254. The CMOS buffer 256 is configured to restore the signals outputted from the capacitors 255 and generate the second clock signals CK2, which are provided to the non-linear equalizer circuit 240.

In some embodiments, the initial clock signal CK0 includes differential clock signals with high frequency, the first clock signals CK1 include differential clock signals with low frequency, and the second clock signals CK2 also include differential clock signals with low frequency. In some embodiments, "high frequency" is referred to as any frequency that would apply in PAM-4 signals including, for example, the amplitude of about 28 GHz. In some embodiments, "low frequency" is referred to as half of the high frequency, which would apply in signals including, for example, the amplitude of about 14 GHz.

The above configuration of the clock signal generator circuit 250 or circuit elements thereof shown in FIG. 2 is given for illustrative purposes. Various configurations of circuits to implement the clock signal generator circuit 250 or circuit elements thereof in FIG. 2 are within the contemplated scope of the present disclosure. For example, in various embodiments, the PLL circuit 251 is implemented by other clock alignment circuits.

FIG. 3 is a schematic diagram of a circuit 300 corresponding to the voltage shifting amplifier circuit 220 shown in FIG. 2, in accordance with various embodiments of the present disclosure. Compared to the embodiments illustrated in FIG. 2, the circuit 300 is illustrated to include three separated voltage shifting amplifier circuits 300-1, 300-2, and 300-3. The voltage shifting amplifier circuits 300-1, 300-2, and 300-3 are connected in parallel with each other.

The input terminal of the voltage shifting amplifier circuit 300-1 is connected to an input terminal (e.g., the input terminal 210 in FIG. 2), and the output terminal of the voltage shifting amplifier circuit 300-1 is connected to an input terminal of, for example, the linear equalizer circuit 230 in FIG. 2. For another example, the output terminal of the voltage shifting amplifier circuit 300-1 is connected to the input terminal of one of the linear equalizer units 231 in FIG. 2.

The voltage shifting amplifier circuit 300-1 is configured to receive the input signal Sin and control signal VOS (as shown in FIG. 2), and configured to shift a voltage reference level of the input signal Sin by adding an offset voltage to the input signal Sin. Accordingly, the voltage shifting amplifier circuit 300-1 generates the output signal S1-1 with the shifted voltage reference level.

Similar to the configuration of the voltage shifting amplifier circuit 300-1, the input terminal of the voltage shifting amplifier circuit 300-2 is connected to the same input terminal, and the output terminal of the voltage shifting amplifier circuit 300-2 is connected to an input terminal of the linear equalizer circuit 230 or the input terminal of one of the linear equalizer units 231 in FIG. 2.

The voltage shifting amplifier circuit 300-2 is configured to receive the input signal Sin and control signal VOS (as shown in FIG. 2), and configured to shift the voltage reference level of the input signal Sin by adding the offset voltage, other than the offset voltage for the voltage shifting amplifier circuit 300-1, to the input signal Sin. Accordingly, the voltage shifting circuit 300-2 generates the output signal S1-2 with the shifted voltage reference level.

Similar to the configuration of the voltage shifting amplifier circuits 300-1 and 300-2, the input terminal of the voltage shifting amplifier circuit 300-3 is connected to the same input terminal, and the output terminal of the voltage shifting amplifier circuit 300-3 is connected to an input terminal of the linear equalizer circuit 230 or the input terminal of one of the linear equalizer units 231 in FIG. 2.

The voltage shifting amplifier circuit 300-3 is configured to receive the input signal Sin and control signal VOS (as shown in FIG. 2), and configured to shift the voltage reference level of the input signal Sin by adding the offset voltage, different from the offset voltage for the voltage shifting amplifier circuit 300-1 or 300-2, to the input signal Sin. Accordingly, the voltage shifting circuit 300-3 generates the output signal S1-3 with the shifted voltage reference level.

For illustration in FIG. 3, the voltage shifting amplifier circuit 300-1 includes an amplifier 310-1 and a summer 320-1. The amplifier 310-1 and the summer 320-1 are connected to each other.

The summer 320-1 is configured to add a shifting signal S2-1 with the offset voltage noted as "−Vshift" to the input signal Sin. The amplifier 310-1 is configured to receive the output of the summer 320-1 and generate the output signal S1-1.

Similarly, in FIG. 3, the voltage shifting amplifier circuit 300-2 includes an amplifier 310-2 and a summer 320-2. The amplifier 310-2 and the summer 320-2 are connected to each other.

The summer 320-2 is configured to add a shifting signal S2-2 with the offset voltage noted as "0" to the input signal Sin. The amplifier 310-2 is configured to receive the output of the summer 320-2 and generate the output signal S1-2.

Similarly, in FIG. 3, the voltage shifting amplifier circuit 300-3 includes an amplifier 310-3 and a summer 320-3. The amplifier 310-3 and the summer 320-3 are connected to each other.

The summer 320-3 is configured to add a shifting signal S2-3 with the offset voltage noted as "+Vshift" to the input signal Sin. The amplifier 310-3 is configured to receive the output of the summer 320-3 and generate the output signal S1-3.

In some embodiments, the input signal Sin is implemented by PAM-4 signal with two bits per symbol, and the output signals S1-1, S1-2 and S1-3 are also implemented by PAM-4 signal. The PAM-4 signal provides four analog voltage levels, including +H, +h, −h, and −H, corresponding to four Gray coded bit combinations, including 10, 11, 01, and 00, and also provides three voltage thresholds as eye-openings. Accordingly, waveform of signals implemented by PAM-4 signals is represented as an eye diagram with three eye-openings in some embodiments. As illustrated in FIG. 3, the input signal Sin is shown as an eye diagram 30, the output signal S1-1 is shown as an eye diagram 31, the output signal S1-2 is shown as an eye diagram 32, and the output signal S1-3 is shown as an eye diagram 33.

For illustration in the above eye diagrams, each one of the eye diagrams 30, 31, 32, and 33 indicates time on x-axis and voltage on y-axis.

In the eye diagram 30, the eye diagram 30 includes a first eye 30-1, a second eye 30-2, and a third eye 30-3. The first eye 30-1 is above the second eye 30-2, and the second eye 30-2 is above the third eye 30-3. The middle voltage value of each one of the first eye 30-1, the second eye 30-2, and the third eye 30-3 indicates a corresponding voltage threshold that is between any two adjacent analog voltage levels. In some embodiments, the voltage threshold is indicated at the middle of the second eye 30-2, noted as dash line with "0 V", which also refers to differential zero data.

Similarly, in the eye diagram 31, the eye diagram 31 includes a first eye 31-1, a second eye 31-2, and a third eye 31-3. The first eye 31-1 is above the second eye 31-2, and the second eye 31-2 is above the third eye 31-3. Different from the differential zero data of the input signal Sin in eye diagram 30, in eye diagram 31, the differential zero data is indicated at the middle of the first eye 31-1 in response to the offset voltage (for example, voltage noted as "−Vshift" added within voltage shifting circuit 300-1).

In the eye diagram 32, the eye diagram 32 includes a first eye 32-1, a second eye 32-2, and a third eye 32-3. The first eye 32-1 is above the second eye 32-2, and the second eye 32-2 is above the third eye 32-3. Similar to the differential zero data of the input signal Sin in eye diagram 30, in eye diagram 32, the differential zero data is indicated at the middle of the second eye 32-2 in response to the offset voltage (for example, voltage noted as "0" added within voltage shifting circuit 300-2).

In the eye diagram 33, the eye diagram 33 includes a first eye 33-1, a second eye 33-2, and a third eye 33-3. The first eye 33-1 is above the second eye 33-2, and the second eye 33-2 is above the third eye 33-3. Different from the differential zero data of the input signal Sin in eye diagram 30, in eye diagram 33, the differential zero data is indicated at the middle of the third eye 33-3 in response to the offset voltage (for example, voltage noted as "+Vshift" added within voltage shifting circuit 300-3).

Figure 4:
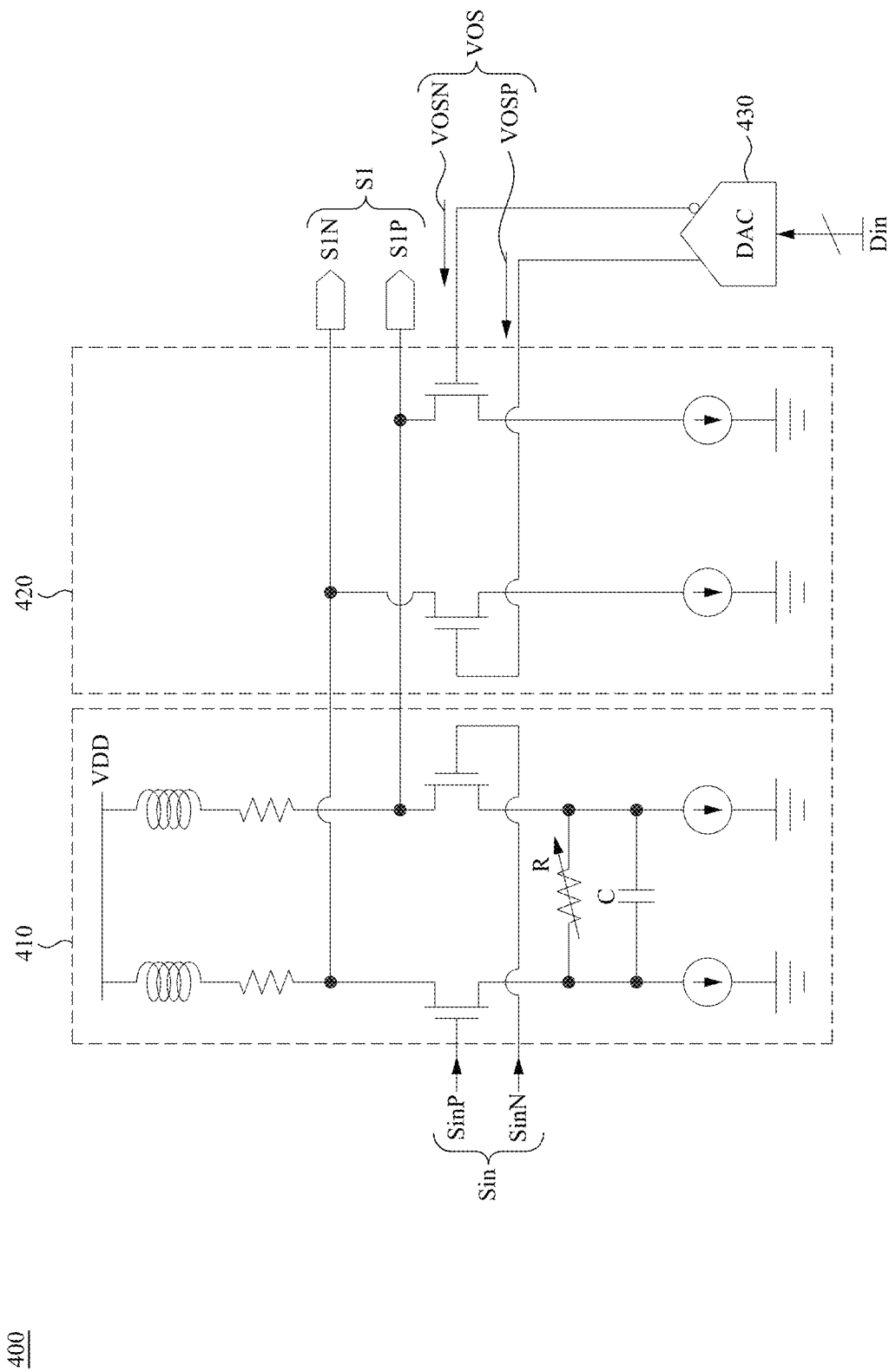
FIG. 4 is a circuit diagram of a voltage shifting amplifier circuit associated with one of the voltage shifting amplifier circuits shown in FIG. 3, in accordance with some embodiments of the present disclosure.

FIG. 4 is a circuit diagram of a voltage shifting amplifier circuit 400 associated with one of the voltage shifting amplifier circuits 300-1, 300-2, and 300-3 shown in FIG. 3, in accordance with some embodiments of the present disclosure. In some embodiments, the voltage shifting amplifier circuit 400 is used for implementing one of the voltage shifting amplifier circuits 300-1, 300-2, and 300-3 in FIG. 3.

For illustration in FIG. 4, the voltage shifting amplifier circuit 400 includes a first differential amplifier 410 and a second differential amplifier 420. The first differential amplifier 410 is connected to the second differential amplifier 420. In some embodiments, the first differential amplifier 410 and the second differential amplifier 420 together correspond to, for example, the amplifier 310-1 and the summer 320-1 of the voltage shifting amplifier circuit 300-1.

For illustration in FIG. 4, the first differential amplifier 410 is configured to receive differential input signal SinP, SinN, and configured to generate differential output signal S1N, S1P.

In some embodiments, differential input signal SinP, SinN corresponds to the input signal Sin in FIGS. 2 and 3. For simplicity, each one of the signals SinP and SinN is referenced as Sin hereinafter for illustration, since each one of the signals SinP and SinN has a similar feature in some embodiments. In some embodiments, differential output signal S1N, S1P corresponds to at least one of the output signals S1-1, S1-2 and S1-3 in FIG. 3. For simplicity, each one of the signals S1P and S1N is referenced as S1 hereinafter for illustration, since each one of the signals S1P and S1N has a similar feature in some embodiments.

As illustrated in FIG. 4, the first differential amplifier 410 includes a variable resistor R and a capacitor C, which are operated as a RC filter. The RC filter is configured to modulate the behavior of linear equalization. For example, the bandwidth of the differential input signal Sin to be equalized is affected by impedance of the variable resistor R and the capacitor C.

The configuration of the first differential amplifier 410 shown in FIG. 4 is given for illustrative purposes. Various configurations of the first differential amplifier 410 are within the contemplated scope of the present disclosure. For example, in various embodiments, the first differential amplifier 410 further includes another RC filter other than that shown in FIG. 4. Accordingly, the first differential amplifier 410 provides multiple stages of linear equalization (e.g., multiple stages of CTLE).

The second differential amplifier 420 is configured to receive differential control signals VOSN, VOSP and configured to generate signals (not shown) to be added to the differential input signal SinP, SinN of the first differential amplifier 410. Alternatively, the second differential amplifier 420 is configured to be controlled with the differential control signals VOSN, VOSP and configured to generate signals with the offset voltage to be added to the differential input signal SinP, SinN.

The voltage shifting amplifier circuit 400 further includes a DAC 430. The DAC 430 is connected to the second differential amplifier 420. In some embodiments, the DAC 430 corresponds to the DAC 270-1 in FIG. 2. In some embodiments, the DAC 430 is integrated with at least one of the first differential amplifier 410 or the second differential amplifier 420.

The DAC 430 is configured to convert digital input signal Din into the differential control signal VOSN, VOSP.

In some embodiments, differential control signal VOSN, VOSP corresponds to at least one of the control signals VOS in FIG. 2. For simplicity, each one of the differential control signal VOSN, VOSP is referenced as VOS hereinafter for illustration.

In some embodiments, the voltage shifting amplifier circuit 400 further includes a voltage amplitude detector (not shown in FIG. 4), which is connected to the first differential amplifier 410, the second differential amplifier 420 and the DAC 430.

The voltage amplitude detector is configured to capture the maximum voltage and the minimum voltage of the differential input signal Sin, and configured to generate the voltage amplitude of the differential input signal Sin, indicated as Vin (not shown in FIG. 4). In some embodiments, the voltage amplitude detector is further configured to generate the digital input signal Din based on the voltage amplitude Vin. Accordingly, the DAC 430 is configured to generate the differential control signal VOS based on the voltage amplitude Vin.

With reference to FIGS. 3 and 4, in some embodiments, the voltage amplitude detector is configured to generate the voltage amplitude Vin of the differential input signal Sin, and the DAC 430 is configured to convert the digital input signal Din based on voltage of Vin/3, in response to three eye-openings of the input signal Sin, into the differential control signal VOS.

The configuration of DAC 430 or differential control signal VOS shown in FIG. 4 is given for illustrative purposes. Various configurations of circuits to implement the DAC 430 differential control signal VOS in FIG. 4 are within the contemplated scope of the present disclosure. For example, in various embodiments, the voltage amplitude detector is integrated with the DAC 430. In other various embodiments, differential control signal VOS is programmable and is controlled by the DAC 430 based on the digital input signal Din.

In some embodiments, when the differential control signal VOSP and VOSN are different from each other, the second differential amplifier 420 is configured to generate corresponding differential signals. For example, when the differential control signal VOSP is less than the other one differential control signal VOSN (i.e., VOSP<VOSN), the second differential amplifier 420 is configured to generate differential signals (e.g., the signal S2-1 shown in FIG. 3) with negative offset voltage (e.g., "−Vshift" shown in FIG. 3). Accordingly, the first differential amplifier 410 is configured to generate output signal S1 with up-shifted differential zero data (e.g., the eye diagram 31 in FIG. 3).

For another example, when the differential control signal VOSP equals to the other one differential control signal VOSN (i.e., VOSP=VOSN), the second differential amplifier 420 is configured to generate differential signals (e.g., the signal S2-2 shown in FIG. 3) without offset voltage (e.g., "0" shown in FIG. 3). Accordingly, the first differential amplifier 410 is configured to generate output signal S1 without shifted differential zero data (e.g., the eye diagram 32 in FIG. 3).

For another example, when the differential control signal VOSP is greater than the other one differential control signal VOSN (i.e., VOSP>VOSN), the second differential amplifier 420 is configured to generate differential signals (e.g., the signal S2-3 shown in FIG. 3) with positive offset voltage (e.g., "+Vshift" shown in FIG. 3). Accordingly, the first differential amplifier 410 is configured to generate output signal S1 with down-shifted differential zero data (e.g., the eye diagram 33 in FIG. 3).

In some approach, the CTLE circuit included in the receiver is configured to capture three eye-openings of the input signal by offsetting a fixed bias voltage of, for example, +50 mV or −50 mV, and configured to output linearly equalized signal. Accordingly, each one of eye-openings is not accurately captured and equalized linearly. In this situation, when applying non-linear equalization to the linearly equalized signal, such linearly equalized signal processed by non-linearly equalized circuit has serious bit error ratio (BER) loss.

Compared to the above approaches, in the present disclosure of some embodiments, the linear equalizer circuit 230 of FIG. 2, with the voltage shifting amplifier circuits 300-1, 300-2, 300-3, is configured to linearly equalize three eye-openings of the input signal Sin by adding the offset voltages to the input signal Sin before performing linear equalization. Thus, the central of each of the eye-openings is able to be captured, which is an example of the differential zero data (e.g., "0 V" in eye diagram 31 in FIG. 3) and is located around the middle of each of the eye-openings. The linearly equalized signals based on different differential zero data are then able to lead to less BER loss in following operations.

Figure 5:
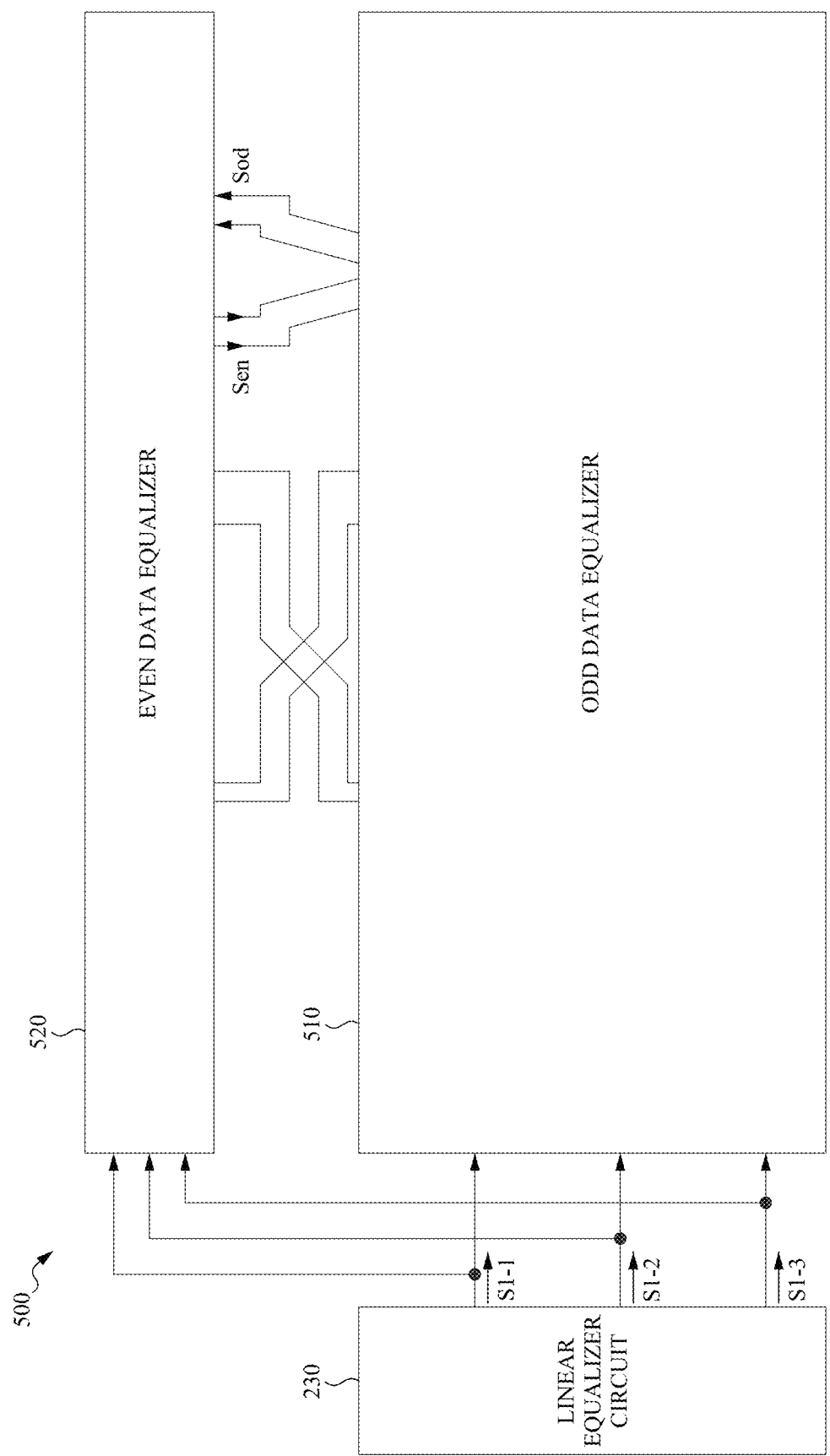
FIG. 5 is a schematic diagram of a circuit associated with the non-linear equalizer circuit the shown in FIG. 2, in accordance with some embodiments of the present disclosure.

FIG. 5 is a schematic diagram of a circuit 500 associated with the non-linear equalized circuit 240 shown in FIG. 2 in accordance with some embodiments of the present disclosure. With respect to the embodiments of FIGS. 2, 3 and 4, like elements in FIG. 5 are designated with the same reference numbers for ease of understanding.

For illustration in FIG. 5, the circuit 500 is connected to the linear equalizer circuit 230. The circuit 500 includes an odd data equalizer 510 and an even data equalizer 520. The odd data equalizer 510 and the even data equalizer 520 are connected to each other.

The input terminals of the odd data equalizer 510 are connected to the output terminals of the linear equalizer circuit 230, and the output terminals of the odd data equalizer 510 are connected to the input terminals of the even data equalizer 520.

The odd data equalizer 510 is configured to receive signals S1-1, S1-2 and S1-3 outputted from the linear equalizer circuit 230, configured to equalize the signals S1-1 S1-2 and S1-3 non-linearly and respectively, and configured to generate odd data signals Sod.

The input terminals of the even data equalizer 520 are connected to the output terminals of the linear equalizer circuit 230, and the output terminals of the even data equalizer 520 are connected to the input terminals of the odd data equalizer 510.

The even data equalizer 520 is configured to receive the signals S1-1, S1-2 and S1-3 outputted from the linear equalizer circuit 230, configured to equalize the signals S1-1, S1-2 and S1-3 non-linearly and respectively, and configured to generate even data signals Sen.

The configuration of circuit 500 shown in FIG. 5 is given for illustrative purposes. Various configurations of circuits to implement the circuit 500 in FIG. 5 are within the contemplated scope of the present disclosure. For example, in various embodiments, the circuit 500 is implemented by decision feedback equalizer (DFE) circuit. In other various embodiments, the odd data equalizer 510 and the even data equalizer 520 have the same configuration.

Figure 6:
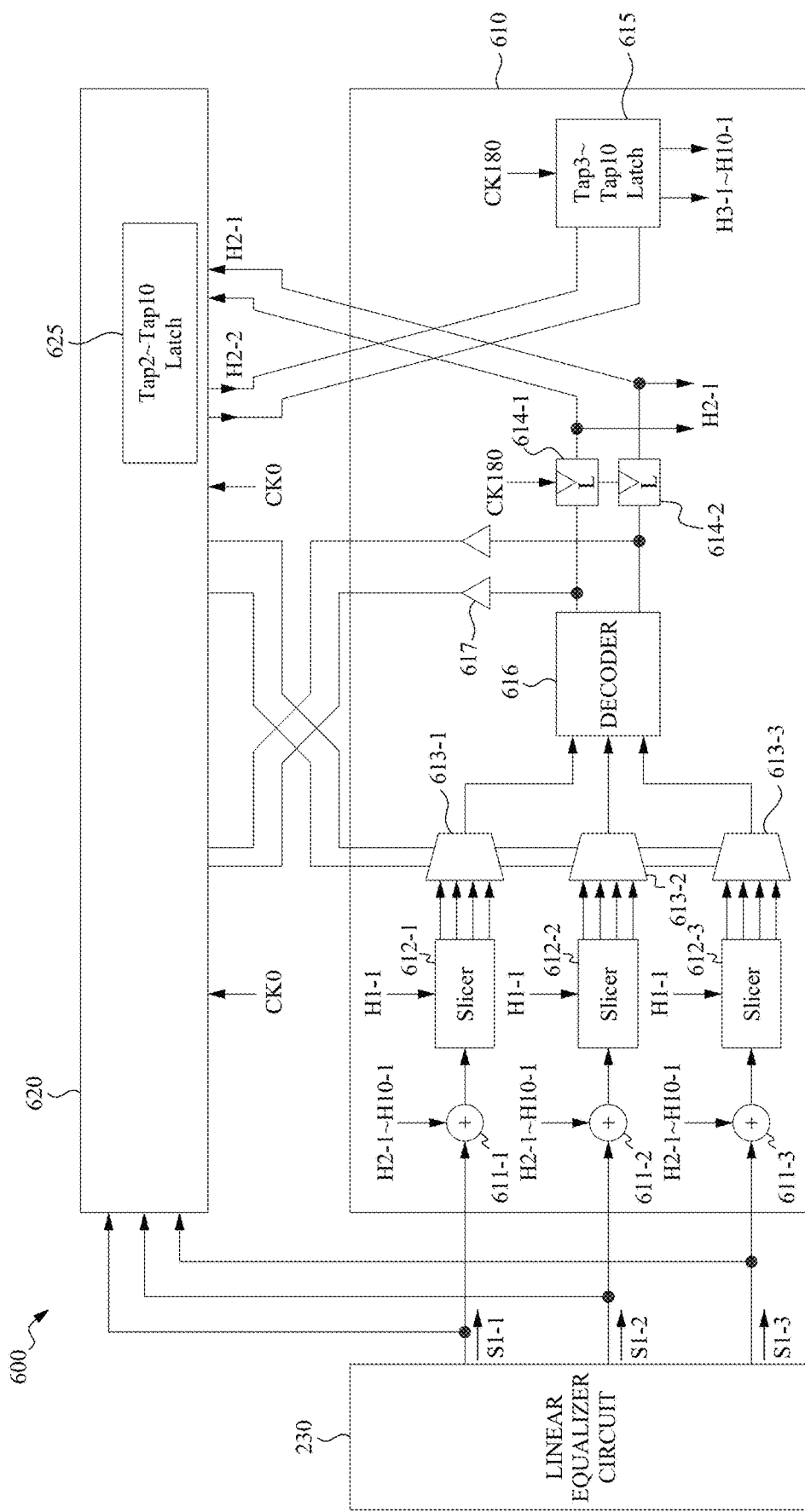
FIG. 6 is a schematic diagram of a circuit associated with the non-linear equalizer circuit shown in FIGS. 2 and 5, in accordance with some embodiments of the present disclosure.

FIG. 6 is a schematic diagram of a circuit 600 associated with the non-linear equalizer circuit 240 shown in FIG. 2, and circuit 500 shown in FIG. 5, in accordance with some embodiments of the present disclosure. With respect to the embodiments of FIGS. 2, 3, 4, and 5 like elements in FIG. 6 are designated with the same reference numbers for ease of understanding.

For illustration in FIG. 6, the circuit 600 is connected to the linear equalizer circuit 230. The circuit 600 includes an odd data equalizer 610 and an even data equalizer 620. The odd data equalizer 610 and the even data equalizer 620 are connected to each other.

In some embodiments, the circuit 600 shown in FIG. 6 corresponds to the circuit 500 shown in FIG. 5. In some embodiments, the odd data equalizer 610 shown in FIG. 6 corresponds to the odd data equalizer 510 shown in FIG. 5. In some embodiments, the even data equalizer 620 shown in FIG. 6 corresponds to the even data equalizer 520 shown in FIG. 5. In some embodiments, the linear equalizer circuit 230 shown in FIG. 6 corresponds to at least one of the linear equalizer circuit 230 shown in FIG. 2, the voltage shifting amplifier circuits 300-1, 300-2 and 300-3 shown in FIG. 3, the voltage shifting amplifier circuit 400 shown in FIG. 4, and the linear equalizer circuit 230 shown in FIG. 5.

The odd data equalizer 610 is configured to receive linearly equalized signals S1-1, S1-2, and S1-3 outputted from the linear equalizer circuit 230 in response to control signals CK180, and configured to generate odd data signals.

The even data equalizer 620 is configured to receive the linearly equalized signals S1-1, S1-2, and S1-3 outputted from the linear equalizer circuit 230 in response to control signals CK0, and configured to generate even data signals.

The configuration of odd data equalizer 610 or even data equalizer 620 shown in FIG. 6 is given for illustrative purposes. Various configurations of circuits to implement the odd data equalizer 610 or the even data equalizer 620 in FIG. 6 are within the contemplated scope of the present disclosure. For example, in various embodiments, at least one of the odd data equalizer 610 and the even data equalizer 620 is implemented by DFE circuit within 10-tap with one-tap speculation. In some embodiment, the odd data equalizer 610 and the even data equalizer 620 have the same configuration. Accordingly, for simplicity, only details circuits of the odd data equalizer 610 are illustrated in FIG. 6 and the followings.

In some embodiments, the odd data signals indicate signals generated or outputted from the odd data equalizer 610, including a first plurality of feedback signals H2-1·H10-1. In some embodiments, the even data signals indicate signals generated or outputted from the even data equalizer 620, including a second plurality of feedback signals H2-2~H10-2 (not shown in FIG. 6).

For simplicity, each one of the signals S1-1, S1-2 and S1-3 is referenced as S1 hereinafter for illustration, since each one of the signals S1-1, S1-2 and S1-3 has a similar feature in some embodiments.

The configuration of the control signals CK0 and CK180 shown in FIG. 6 is given for illustrative purposes. Various configurations of signals to implement the control signals CK0 and CK180 in FIG. 6 are within the contemplated scope of the present disclosure. For example, in various embodiments, the control signals CK0 and CK180 are implemented by clock signals with opposite sequence corresponding to opposite phases of one period.

Compared to the embodiments illustrated in FIG. 5, the odd data equalizer 610 includes a plurality of summer circuits 611-1, 611-2 and 611-3, a plurality of slicer circuits 612-1, 612-2 and 612-3, a plurality of multiplexers 613-1, 613-2 and 613-3, a first plurality of latches 614-1 and 614-2, and a second plurality of latches 615 (shown as one block in FIG. 6).

For simplicity, each one of the summer circuits 611-1, 611-2 and 611-3 is referenced as 611 hereinafter for illustration, since each one of the summer circuits 611-1, 611-2 and 611-3 operates in a similar way in some embodiments. Based on similar reasons, each one of the slicer circuits 612-1, 612-2 and 612-3 is referenced as 612 hereinafter for illustration, each one of the multiplexers 613-1, 613-2 and 613-3 is referenced as 613 hereinafter for illustration, and each one of the first plurality of latches 614-1 and 614-2 is referenced as 614 hereinafter for illustration.

In some embodiments, the odd data equalizer 610 and the even data equalizer 620 have same configuration with different control signal CK0 and CK180, respectively. Accordingly, the circuit 600, including the odd data equalizer 610 and the even data equalizer 620, includes 24 slicer circuits for capturing data and edge information for clock data recover circuit (CDR) (not shown, which is associated with the clock signal generator circuit 250 shown in FIG. 2) adaptation, 6 decoders for reducing circuit loading, 6 summer circuits for summation of multiple feedback signals H2-1~H10-1 and H2-2~H10-1 (not shown totally, which correspond to tap 2 to tap 10 coefficient calculated by the DFE), and a latch array which includes a plurality of latch circuits connected in parallel for data propagation by one unit interval (UI).

The configuration of circuits of the odd data equalizer 610 shown in FIG. 6 is given for illustrative purposes. Various configurations of circuits to implement the circuits of the odd data equalizer 610 in FIG. 6 are within the contemplated scope of the present disclosure. For example, the slicer circuit 612-1 includes another three identical slicer circuits connected in parallel with the slicer circuit 612-1. Namely, the slicer circuit 612-1 indicates four same slicer circuits connected in parallel.

The input terminals of the summer circuits 611 are connected to the output terminals of the linear equalizer 230, the input terminals of summer circuits of the even data equalizer 620 (not shown) in parallel, the output terminals of the first plurality of latches 614, and the output terminals of the second plurality of latches 615. The output terminal of the summer circuits 611 is connected to the input terminal of the slicer circuits 612.

The summer circuits 611 are configured to add a first plurality of feedback signals H2-1~H10-1 to the signals S1.

The input terminal of the slicer circuits 612 is connected to the output terminal of the summer circuits 611. The output terminals of the slicer circuits 612 are connected to the input terminals of the multiplexers 613.

A corresponding group of the slicer circuit 612, for example, in some embodiments, four same slicer circuits 612-1 connected in parallel, is configured to receive an output from the corresponding summer circuit 611, for example, the summer circuit 611-1.

The input terminals of the multiplexers 613 are connected to the output terminals of the slicer circuits 612. The output terminals of the multiplexers 613 are connected to the input terminals of the first plurality of latches 614, and the input terminals of the multiplexers of the even data equalizer 620 (not shown).

One of the multiplexers 613 is configured to receive outputs of the corresponding group of slicer circuits 612, for example, in some embodiments, four same slicer circuits 612-1 connected in parallel. One of the multiplexers 613 is further configured to output part of the odd data signals.

The input terminals of the first plurality of latches 614 are connected to the output terminals of the multiplexers 613. The output terminals of the first plurality of latches 614 are connected to the input terminals of the summer circuits 611 and the first plurality of latches of the even data equalizer 620 (not shown).

The first plurality of latches 614 are configured to receive the odd data signals and configured to generate the first feedback signal, for example, in some embodiments, first feedback signal H2-1, of the first plurality of feedback signals H2-1~H10-1. Similarly, the first plurality of latches (not shown) of the even equalizer circuit 620 are configured to receive the first feedback signal (e.g., first feedback signal H2-1) and configured to generate at least one of the second plurality of feedback signals H2-2~H10-2, for example, in some embodiments, second feedback signal H2-2.

The input terminals of the second plurality of latches 615 are connected to the output terminals of the first plurality of latches of the even data equalizer 620. The output terminals of the second plurality of latches 615 are connected to the input terminals of the summer circuits 611.

The second plurality of latches 615 are configured to receive at least one of second plurality of feedback signals H2-2~H10-2, for example, in some embodiments, second feedback signal H2-2, and configured to generate at least one feedback signal that is different from the first feedback signal (e.g., first feedback signal H2-1), for example, in some embodiments, first feedback signal H3-1.

Moreover for illustration in FIG. 6, the odd data equalizer 610 further includes a decoder 616. The decoder 616 is connected between the multiplexers 613 and the first plurality of latches 614.

The input terminals of the decoder 616 are connected to the output terminals of the multiplexers 613. The output terminals of the decoder 616 are connected to the input terminals of the first plurality of latches 614 and the input terminals of the multiplexers of the even data equalizer 620 (not shown).

The decoder 616 is configured to receive outputs of the multiplexers 613 and configured to output the odd data signals in different data form from which inputted into the decoder 616. In some embodiments, the outputted odd data signals refer to binary data signals, and inputted odd data signal refer to sequence signal with logic signals.

Accordingly, these odd data signals outputted from the multiplexers 613 have less memory than that inputted into the multiplexers 613, in order to reduce the complexity and design difficulty of the control signals which are applied in the odd data equalizer 610 or even data equalizer 620.

Moreover for illustration in FIG. 6, the odd data equalizer 610 further includes a plurality of buffers 617. The buffers 617 are connected between the multiplexers 613 and the first plurality of latches 614.

The input terminals of the buffers 617 are connected to the output terminals of the decoder 616. The output terminals of the buffers 617 are connected to the input terminals of the multiplexers of the even data equalizer 620 (not shown).

The buffers 617 are configured to drive the odd data signals from the output terminals of the decoder 616 of the odd data equalizer 610 to the output terminals of the decoder and the input terminals of the first plurality of latches of the even data equalizer 620.

In some embodiments, signals S1-1, S1-2, and S1-3 outputted from the linear equalizer circuit 230 refers to the linearly equalized signal. In some embodiments, signals S1-1, S1-2, and S1-3 shown in FIG. 6 correspond to signals S1-1, S1-2, and S1-3 with the shifted voltage reference levels shown in FIG. 3, respectively. Accordingly, each one of the signals S1-1, S1-2, and S1-3 is implemented by PAM-4 signal with 4 data levels, which of each level is encoded by two bits.

Moreover for illustration in FIG. 6, in some embodiments, when the linearly equalized signals S1 is outputted from the linear equalizer circuit 230, the summer circuits 611 receive the signals S1.

More specificity, in some embodiments, the summer circuit 611-1 receives the signal S1-1 and passes the signal S1-1 to the slicer circuit 612-1. Simultaneously, the summer circuit 611-2 receives the signal S1-2 and passes the signal S1-2 to the slicer circuit 612-2, and the summer circuit 611-3 receives the signal S1-3 and passes the signal S1-3 to the slicer circuit 612-3.

The slicer circuits 612 receive the signals S1, sample the signals S1 to be equalized within one UI, in response to a first feedback signal H1-1 of the first plurality of feedback signal, and output the odd data signals with selected symbols.

More specificity, in some embodiments, one of the slicer circuits 612-1 receives the signal S1-1 and the first feedback signal H1-1, samples two adjacent symbols of the signal S1-1, and outputs one of the odd data signal. Every four of the slicer circuits 612-1 operates in a similar way, which is not repeated herein. Accordingly, the slicer circuits 612-1 outputs four different odd data signals.

The multiplexers 613 receive the odd data signals outputted from the slicer circuits 612 and output part of the odd data signals to the decoder 616, and part of the odd data signals to the multiplexers (not shown) of the even data equalizer 620.

More specificity, in some embodiments, the multiplexer 613-1 receives the odd data signals outputted from the slicer circuits 612-1, and selects one of these odd data signals based on the signal S1-1 with corresponding shifted voltage reference level. The multiplexer 613-1 outputs the selected odd data signal to the decoder 616 and part of the odd data signals to the corresponding multiplexer of the even data equalizer 620.

In some embodiments, the corresponding multiplexer of the even data equalizer 620 receives the odd data signal, and modulate the even data signals based on such odd data signal, for eliminating the offsetting caused by the selected odd data signal.

The decoder 616 receives the odd data signals outputted from the multiplexers 613, decodes these odd data signals, and outputs part of the odd data signals to the first plurality of latches 614 and part of the odd data signals to the buffers 617.

More specificity, in some embodiments, the decoder 616 receives three odd data signals outputted from the multiplexers 613-1, 613-2 and 613-3, respectively. The decoder 616 further decodes these three odd data signals in form of logic sequence into form of binary data.

The buffers 617 receive part of the odd data signals outputted from the decoder 616 and drive these odd data signals to the input terminal of the first plurality of latches of the even data equalizer 620.

The first plurality of latches 614 receive part of the odd data signals outputted from decoder 616 and the control signals CK180, and generate first plurality of feedback signals H2-1~H10-1 by providing corresponding selected reference signal.

More specificity, in some embodiments, the first plurality of latches 614 receive part of the odd data signals in form of binary data and the control signals CK180 for providing corresponding selected reference signal. The first plurality of latches 614 output one of the first plurality of feedback signals H2-1~H10-1, for example, first feedback signal H2-1, to the second plurality of latches 615 of the even data equalizer 620 for generating one of the following feedback signal of the second plurality of feedback signals H2-2~H10-2, for example, second feedback signal H2-2. Simultaneously, the first plurality of latches 614 output one of the first plurality of feedback signals H2-1~H10-1 (e.g., first feedback signal H2-1) to the summer circuit 611-1. Alternatively, the first feedback signal H2-1 is fed back to the summer circuit 611-1, which indicates that the first post-cursor is calculated for eliminating from the signal S1-1.

At the same time, in some embodiments, when the first feedback signal H2-1 is fed back to the summer circuit 611-1, one of the second plurality of feedback signals H2-2~H10-2 (i.g., the second feedback signal H2-2) is also fed back to the summer circuit of the even data equalizer 620. Similar operations by the first plurality of latches 614, the first plurality of latches of the even data equalizer 620 output one of the second plurality of feedback signals H2-2~H10-2 (i.g., the second feedback signal H2-2) to the second plurality of latches 615 of the odd data equalizer 610 for generating another one of the following feedback signal of the first plurality of feedback signals H2-1~H10-1, for example, first feedback signal H3-1.

The second plurality of latches 615 receive one of the odd data signals outputted from first plurality of latches of the even data equalizer 620 and the control signals CK180, and generate first plurality of feedback signals H2-1~H10-1 by providing corresponding selected reference signal.

More specificity, in some embodiments, the second plurality of latches 615 receives one of the second plurality of feedback signals H2-2~H10-2 (i.g., the second feedback signal H2-2) and the control signals CK180 for providing corresponding selected reference signal. The second plurality of latches 615 output one of the first plurality of feedback signals H2-1~H10-1 (e.g., first feedback signal H3-1) to the summer circuit 611-1. Alternatively, the first feedback signal H3-1 is fed back to the summer circuit 611-1, which indicates that the second post-cursor is calculated for eliminating from the signal S1-1.

Figure 7:
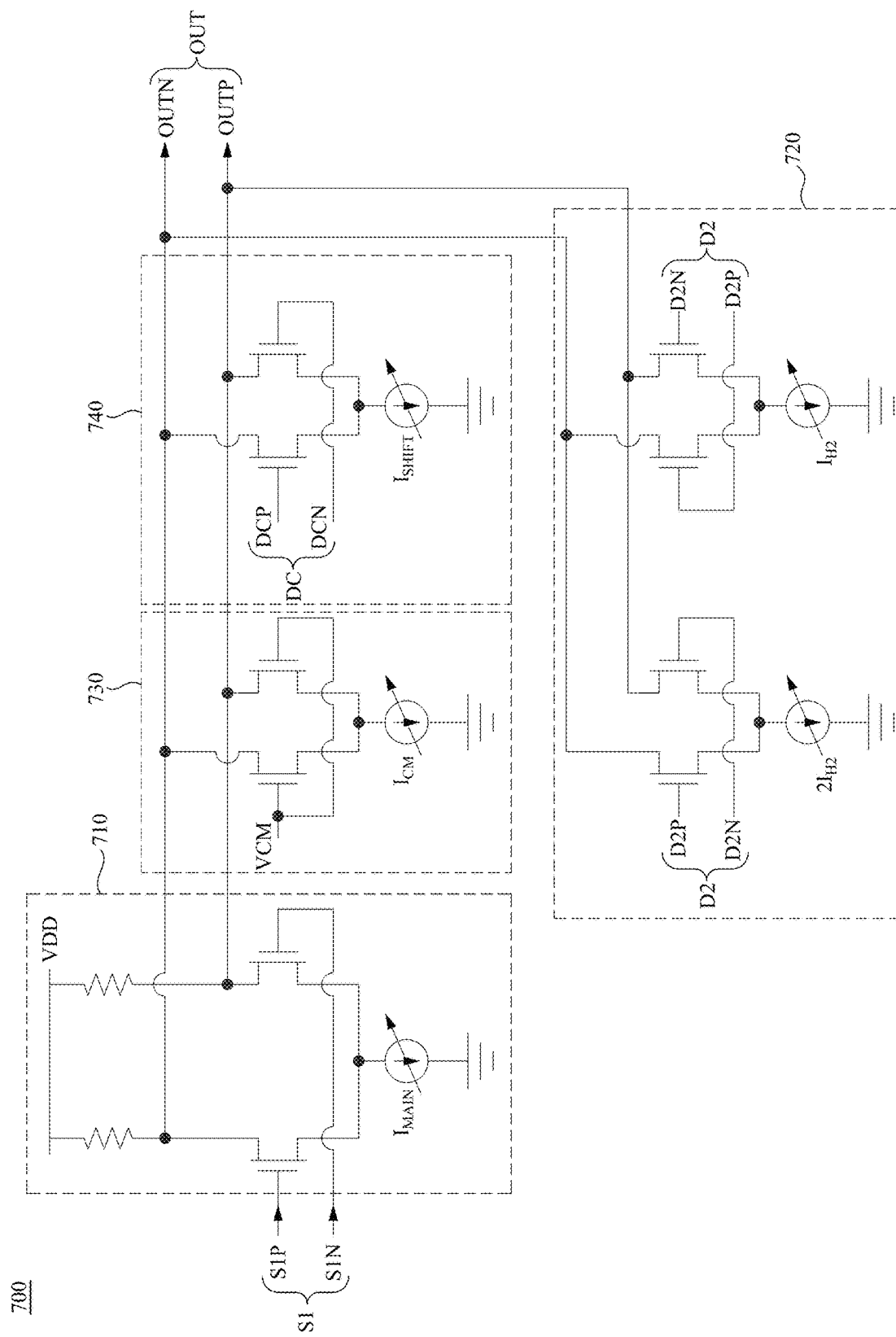
FIG. 7 is a circuit diagram of the summer circuit associated with the summer circuits shown in FIG. 6, in accordance with some embodiments of the present disclosure.

FIG. 7 is a circuit diagram of the summer circuit 700 associated with the summer circuits 611 shown in FIG. 6, in accordance with some embodiments of the present disclosure.

The summer circuit 700 includes a control circuit 710, a plurality of feedback circuits 720, a keeper circuit 730 and a shifter circuit 740. The control circuit 710, the plurality of feedback circuits 720, the keeper circuit 730 and the shifter circuit 740 are connected in parallel.

The control circuit 710 is configured to receive the differential input signal S1N, S1P, which is referenced as signal S1 for simplicity, outputted from the linear equalizer circuit, for example, the linear equalizer circuit 230 shown in FIG. 6. The control circuit 710 is further configured to output the differential output signal OUTN, OUTP, which is referenced as signal OUT for simplicity, to the slicer circuit, for example, the slicer circuit 612 shown in FIG. 6.

For illustration in FIG. 7, the control circuit 710 includes a plurality of resistors, transistors, and a current generator for generating current $I_{MAIN}$. Since the configuration of the control circuit 710 shown in FIG. 7 is given for illustrative purposes, each operations or configuration of the electric components of the control circuit 710 is not illustrated in detail herein.

The feedback circuits 720 are configured to receive differential control signal D2N, D2P, which is referenced as signal D2 for simplicity, outputted from a control circuit, for example, the DAC 270-2 shown in FIG. 2. The feedback circuits 720 is further configured to provide the differential output signal (not shown) which represent one feedback signal indicated as one voltage level with two data bits, for example, the first feedback signals H2-1 shown in FIG. 6.

In some embodiments, the plurality of feedback circuits 720 are connected in parallel. For simplicity, each one of the plurality of feedback circuits 720 is referenced as 720 shown in one block hereinafter for illustration in FIG. 7, since each one of the feedback circuits 720 operates in a similar way in some embodiments.

For illustration in FIG. 7, the feedback circuits 720 includes a plurality of transistor for being controlled by differential signal D2, and a plurality of current generators for generating current $I_{H2}$ and two times of current $I_{H2}$ (i.e., $2I_{H2}$). Since the configuration of the feedback circuits 720 shown in FIG. 7 is given for illustrative purposes, each operations or configuration of the electric components of the feedback circuits 720 is not illustrated in detail herein.

The keeper circuit 730 is configured to receive control signal VCM outputted from a control circuit, for example, the DAC 270-2 shown in FIG. 2. The keeper circuit 730 is further configured to provide the differential output signal (not shown) which may compensate the current difference between each one of the feedback circuits 720, in order to keep the total current of the summer circuit 700 at a fixed reference value, for example, about 3 mA.

For illustration in FIG. 7, the keeper circuit 730 includes a plurality of transistors for being controlled by fixed signal VCM, and a current generator for generating current $I_{CM}$. Since the configuration of the keeper circuit 730 shown in FIG. 7 is given for illustrative purposes, each operations or configuration of the electric components of the keeper circuit 730 is not illustrated in detail herein.

The shifter circuit 740 is configured to receive differential control signal DCP, DCN, which is referenced as signal DC for simplicity, outputted from a control circuit, for example, the DAC 270-2 shown in FIG. 2. The shifter circuit 740 is further configured to provide the differential output signal (not shown) which may adjust the voltage reference level of the differential output signal OUT. Accordingly, the shifter circuit 740 may select one of eye-openings for the following operations by shifting an offset voltage based on the differential control signal DC.

For example, in some embodiments, when the differential control signal DCP is less than the other signal DCN (i.e., DCP<DCN), the shifter circuit 740 is configured to generate differential signals with negative offset voltage. Accordingly, the differential output signal OUT has with up-shifted differential zero data (corresponding to the eye diagram 31 in FIG. 3).

In some embodiments, when the differential control signal DCP equals to the other signal DCN (i.e., DCP=DCN), the shifter circuit 740 is configured to generate differential signals without offset voltage. Accordingly, the differential output signal OUT has without differential zero data (corresponding to the eye diagram 32 in FIG. 3).

In some embodiments, when the differential control signal DCP is greater than the other signal DCN (i.e., DCP>DCN), the shifter circuit 740 is configured to generate differential signals with positive offset voltage. Accordingly, the differential output signal OUT has with down-shifted differential zero data (corresponding to the eye diagram 33 in FIG. 3).

For illustration in FIG. 7, the shifter circuit 740 includes a plurality of transistors for being controlled by differential signal DC, and a current generator for generating current $I_{SHIFT}$. Since the configuration of the shifter circuit 740 shown in FIG. 7 is given for illustrative purposes, each operations or configuration of the electric components of the shifter circuit 740 is not illustrated in detail herein.

The configuration of the summer circuit 700 shown in FIG. 7 is given for illustrative purposes. Various configurations of the summer circuit 700 shown in FIG. 7 are within the contemplated scope of the present disclosure. For example, in some embodiments, the summer circuit 700 includes nine feedback circuits 720, and each of the feedback circuits 720 have same configuration and are connected in parallel. In various embodiments, the summer circuit 700 further includes a DAC which corresponds to the DAC 270-2 shown in FIG. 2, configured to provide differential control signals.

Figure 8:
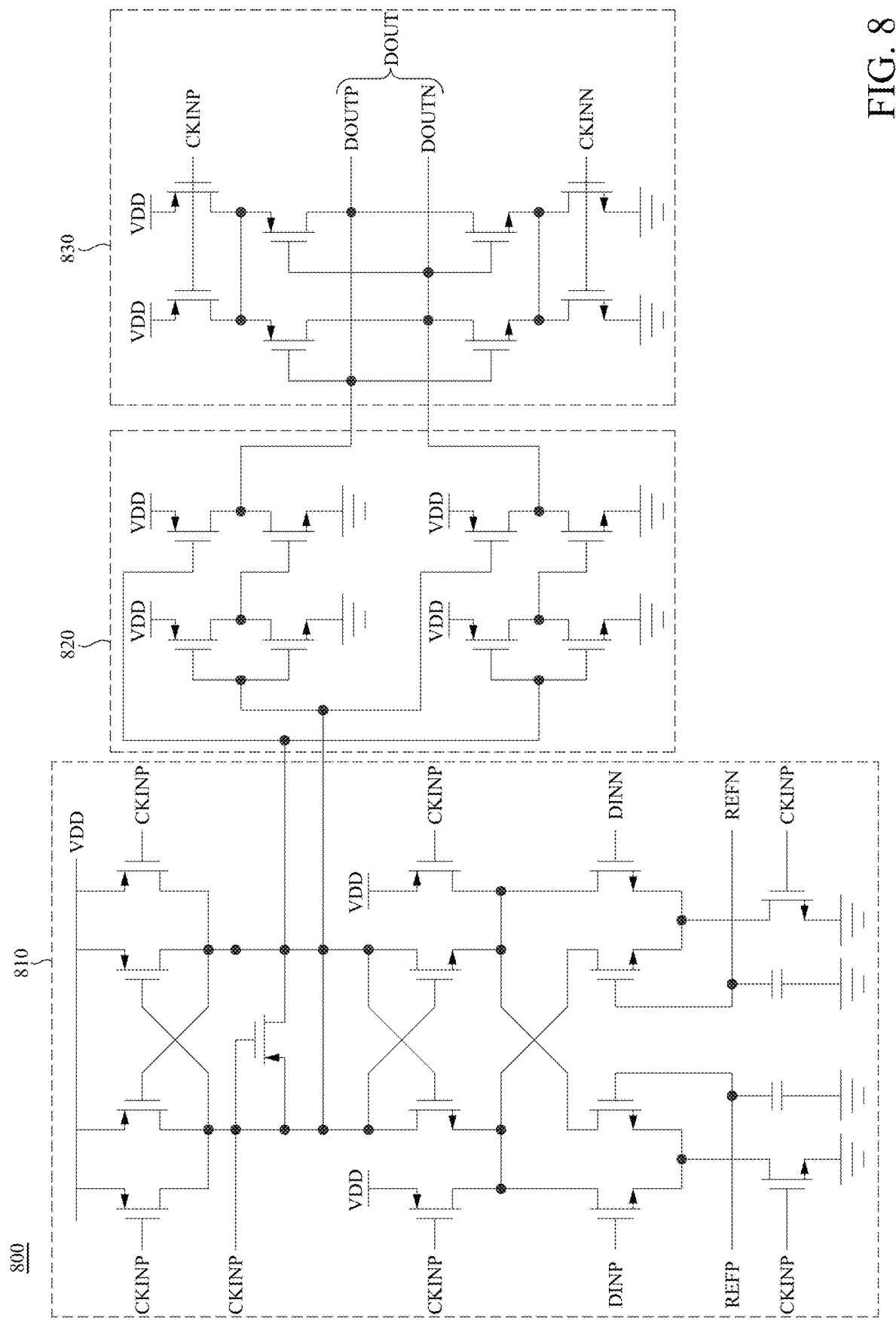
FIG. 8 is a circuit diagram of the slicer circuit associated with the slicer circuits shown in FIG. 6, in accordance with some embodiments of the present disclosure.

FIG. 8 is a circuit diagram of the slicer circuit 800 associated with the slicer circuits 612 shown in FIG. 6, in accordance with some embodiments of the present disclosure. With respect to the embodiments of FIG. 7 like elements or signals in FIG. 8 are designated with the same reference numbers for ease of understanding.

The slicer circuit 800 includes a control circuit 810, a keeper circuit 820 and a buffer circuit 830. The control circuit 810, a keeper circuit 820 and a buffer circuit 830 are connected in series.

The control circuit 810 is configured to receive the differential input signal DINN, DINP, which is referenced as signal DIN for simplicity, outputted from summer circuit, for example, the summer circuits 611-1 shown in FIG. 6, and configured to evaluate the difference of the differential input signal DIN. The control circuit 810 is further configured to receive differential control signal CKINP, CKINN, which is referenced as signal CKIN for simplicity, outputted from a control circuit, for example, the DAC 270-2 shown in FIG. 2, and configured to receive differential control signal REFP, REFN, which is referenced as signal REF for simplicity, outputted from a control circuit, for example, the DAC 270-2 shown in FIG. 2. The control circuit 810 is configured to provide the differential output signal (not shown) which may compensate the difference of the differential input signal DIN and collaborate the mismatching of the differential input signal DIN.

In some embodiments, the differential input signal DIN corresponds to the differential output signal OUT in FIG. 7. In some embodiments, the differential control signal REF is associated with the difference between the differential input signal DIN, in order to compensate the difference between the differential input signal DIN by offsetting one of the differential input signal DIN.

For illustration in FIG. 8, the control circuit 810 includes a plurality of transistor for being controlled by differential signals CKIN and REF, and being affected by differential input signal DIN. Since the configuration of the control circuit 810 shown in FIG. 8 is given for illustrative purposes, each operations or configuration of the electric components of the control circuit 810 is not illustrated in detail herein.

The keeper circuit 820 is configured to receive the signal outputted from the control circuit 810, in order to keep the differential input signal DIN have the previous logic state, in order to clamp the logic state between two data equalizers in parallel, for example, the odd data equalizer 610 and the even data equalizer 620 in FIG. 6, to be the same.

For illustration in FIG. 8, the keeper circuit 820 includes a plurality of transistor as converters. Since the configuration of the keeper circuit 820 shown in FIG. 8 is given for illustrative purposes, each operations or configuration of the electric components of the keeper circuit 820 is not illustrated in detail herein.

The buffer circuit 830 is configured to receive differential control signal CKIN outputted from a control circuit, for example, the DAC 270-2 shown in FIG. 2. The buffer circuit 830 is further configured to output the differential signal DOUTP, DOUTN, which is referenced as signal DOUT for simplicity, which may amplify the difference of one feedback signal indicated as one voltage level with two data bits, for example, the first feedback signals H2-1 shown in FIG. 6.

The configuration of the slicer circuit 800 shown in FIG. 8 is given for illustrative purposes. Various configurations of the slicer circuit 800 shown in FIG. 8 are within the contemplated scope of the present disclosure. For example, in some embodiments, the slicer circuit 800 further includes a DAC which corresponds to the DAC 270-2 shown in FIG. 2, configured to provide differential control signals.

Figure 9:
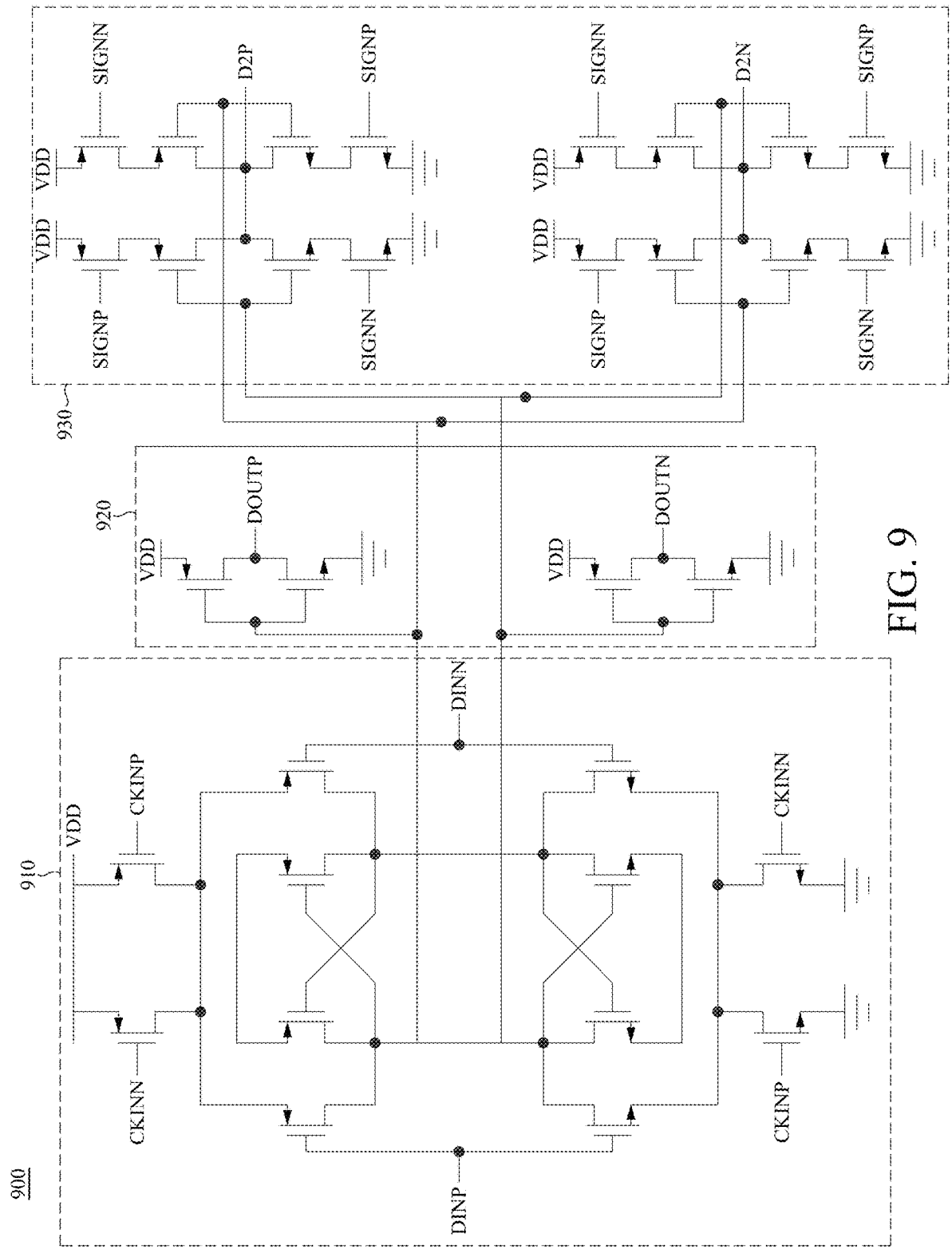
FIG. 9 is a circuit diagram of the latch circuit associated with the latch circuits shown in FIG. 6, in accordance with some embodiments of the present disclosure.

FIG. 9 is a circuit diagram of the latch 900 associated with at least one of the first plurality of latches 614 and the second plurality of latches 615 shown in FIG. 6, in accordance with some embodiments of the present disclosure. With respect to the embodiments of FIGS. 7 and 8 like elements or signals in FIG. 9 are designated with the same reference numbers for ease of understanding.

The latch 900 includes a control circuit 910, a first buffer circuit 920 and a second buffer circuit 930. The control circuit 910, the first buffer circuit 920, and the second buffer circuit 930 are connected in parallel.

The control circuit 910 is configured to receive differential input signal DIN outputted from multiplexer, for example, the multiplexer 613-1 shown in FIG. 6, and configured to receive the differential control signal CKIN outputted from a control circuit, for example, the DAC 270-2 shown in FIG. 2. The control circuit 910 is further configured to provide the differential output signal (not shown) for the following operations.

For illustration in FIG. 9, the control circuit 910 includes a plurality of transistor for being controlled by differential signal CKIN, and being affected by differential input signal DIN. Since the configuration of the control circuit 910 shown in FIG. 9 is given for illustrative purposes, each operations or configuration of the electric components of the control circuit 910 is not illustrated in detail herein.

The first buffer circuit 920 is configured to receive the signal outputted from the control circuit 910 and differential signal DOUT outputted from another functional circuit, for example, the multiplexer 613-1 or the slicer circuits 612-1 shown in FIG. 6 or the buffer circuit 830 shown in FIG. 8. The first buffer circuit 920 is further configured to provide the differential signal DOUT to the latch, for example, the buffer circuit 830 shown in FIG. 8, in order to provide the following feedback signal, for example, the second feedback signal H2-2 other than the first feedback signal H2-1 shown in FIG. 6.

For illustration in FIG. 9, the first buffer circuit 920 includes a plurality of transistor as converters. Since the configuration of the first buffer circuit 920 shown in FIG. 9 is given for illustrative purposes, each operations or configuration of the electric components of the first buffer circuit 920 is not illustrated in detail herein.

The second buffer circuit 930 is configured to receive the differential control signal SIGNP, SIGNN, which is referenced as signal SIGN for simplicity, outputted from a control circuit, for example, the DAC 270-2 shown in FIG. 2. The second buffer circuit 930 is further configured to provide the differential signal D2N, D2P, which is referenced as signal D2 for simplicity, to the following circuit, for example, the summer circuit 611-1 shown in FIG. 6, in order to provide the current feedback signal, for example, first feedback signal H2-1 shown in FIG. 6.

For illustration in FIG. 9, the second buffer circuit 930 includes a plurality of transistor for being controlled by differential signal SIGN. Since the configuration of the second buffer circuit 930 shown in FIG. 9 is given for illustrative purposes, each operations or configuration of the electric components of the second buffer circuit 930 is not illustrated in detail herein.

Moreover for illustration in FIG. 9, in some embodiments, with the table shown below, when the current feedback signal is operating, the input signals, including the differential input signal DIN, the differential control signal CKIN and differential control signal SIGN, and the output signals, including the differential signal DOUT and the differential signal D2, are operated as the logic value in the below table.

| DINN | DINP | SIGNP | SIGNN | DOUTP | DOUTN | D2N | D2P |
|---|---|---|---|---|---|---|---|
| 0 | 1 | 0 | 1 | 0 | 1 | 0 | 1 |
| 0 | 1 | 1 | 0 | 0 | 1 | 1 | 0 |
| 1 | 0 | 0 | 1 | 1 | 0 | 1 | 0 |
| 1 | 0 | 1 | 0 | 1 | 0 | 0 | 1 |

In some embodiments, for example, when calculating one first feedback signal H2-1 corresponding to the one of the signal with Gray coded bit by 10, the logic state of the differential input signal DIN and the differential control signal SIGN both are [0,1], and the logic state of differential signal DOUT and the differential signal D2 both are [0,1]. When calculating one first feedback signal H2-1 corresponding to corresponding to the another one of the signal with Gray coded bit by 11, the logic state of the differential input signal DIN are [0,1] the differential control signal SIGN are [1,0], the logic state of differential signal DOUT are [0,1] and the differential signal D2 are [1,0]. When one first feedback signal H2-1 corresponding to the remaining of the signal with Gray coded bit by 01 and 00, the logic state of signals is shown in the third row and the fourth row respectively in above table.

In some approach, the DFE circuit included in the receiver is configured to generate output non-linearly equalized signal by one single equalizer circuit. Accordingly, each one of feedback signals does not be calculate within one UI, which leads to generate inaccurate and distorted non-linearly equalized signal.

Furthermore, in some approach, the receiver includes the CTLE circuit which is configured to capture eye-openings by offsetting a fixed bias voltage and followed by the DFE circuit with single equalizer circuit. Accordingly, the non-linearly equalized signal outputted from the DFE circuit has more serious BER loss resulted from signals outputted from the CTLE circuit.

Compared to the above approaches, in the present disclosure of some embodiments, the non-linear equalizer circuit, including two separated equalizers in parallel (for example, the odd data equalizer 610 and the even data equalizer 620 shown in FIG. 6), included in the receiver is configured to equalize the input signal non-linearly by calculating one symbol with two data bit in two equalizer simultaneously and alternatively. Accordingly, the non-linear equalizer may calculate one symbol within half of the timing closure (i.e., half of one UI). Thus, the non-linear equalizer circuit may ease the timing closure and expand one UI to 2UI. That is, the non-linear equalizer circuit may achieve timing closure of each of the feedback loops that enables post bit (cursor) decisions to properly influence the decision made by the current bit. The non-linearly equalized signals may lead to less BER loss in the following operations, which further reach good power efficiency of signal transmission. Therefore, signal with less BER loss may be apply in the communication system within long transmitted distance.

Based on the above embodiments, compared to some approaches in conventional art, the receiver 200 and/or the circuits configured therein are able to be applied with improved parameters, such as smaller area, better coverage of channel loss, reduced figure of merit (FoM) (referred to as power divided by bit rate divided by channel loss coverage), and the like. For example, in some embodiments, area for implementing the circuit is reduced to, for example, 0.352 mm$^2$, and channel loss coverage of the receiver 200 is increased to, for example, 25 dB, and FoM of the receiver 200 is decreased to, for example, 0.321 (pJ/bit/dB), for higher transmission performance.

Figure 10:
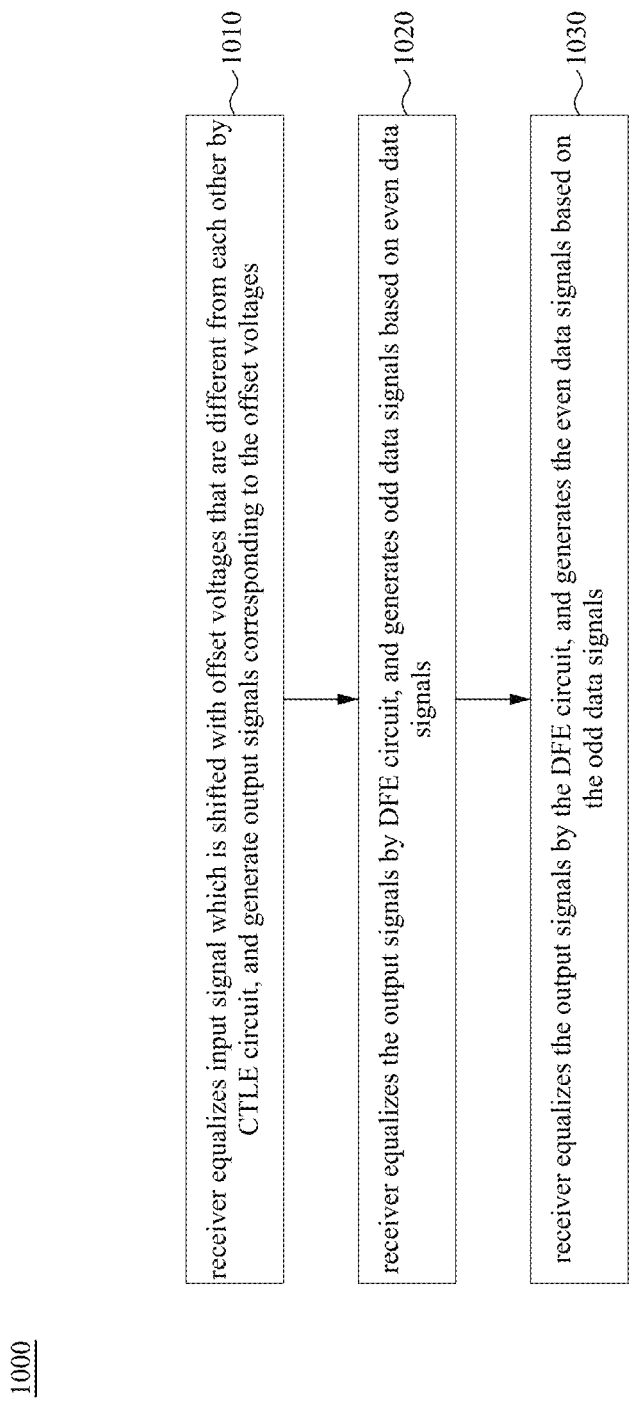
FIG. 10 is a flow chart of a method 1000 illustrating operations of the receiver, in accordance with some embodiments of the present disclosure.

FIG. 10 is a flow chart of a method 1000 illustrating operations of the receiver 200 in FIG. 2, in accordance with some embodiments of the present disclosure. Following illustrations of the method 1000 in FIG. 10 with reference to the receiver 200 in FIG. 2 include exemplary operations. However, the operations in FIG. 10 are not necessarily performed in the order shown. Alternatively stated, operations may be added, replaced, changed order, and/or eliminated as appropriate, in accordance with the spirit and scope of various embodiments of the present disclosure.

In operation 1010, the receiver 200 equalizes the input signal Sin which is shifted with offset voltages that are different from each other by the CTLE circuit, and generate output signals corresponding to the offset voltages.

In some embodiment, the CTLE circuit indicates the linear equalizer circuit 230 in FIG. 2. In some embodiment, the CTLE circuit indicates the voltage shifting amplifier circuits 220 in FIG. 2. In some embodiment, the CTLE circuit indicates the voltage shifting amplifier circuits 220 and the linear equalizer circuit 230 in FIG. 2. In some embodiment, the offset voltages indicate the voltages including which are noted as "−Vshift", "0", and "+Vshift" in FIG. 3.

Moreover, in some embodiments, receiver 200 also converts a digital input signal into a differential control signal by the CTLE circuit.

In some embodiment, the receiver 200 converts the digital input signal into the differential control signal by a converter, for example, the DAC 270-1 in FIG. 2 or the DAC 430 in FIG. 4, included in the CTLE circuit. In some embodiment, the differential control signal indicates differential control signal VOS shown in FIG. 2 or FIG. 4.

Furthermore, receiver 200 also controls a differential amplifier with the differential control signal, and generates one of the offset voltages to be added to the input signal Sin.

In some embodiment, the differential amplifier indicates the voltage shifting amplifier circuit 400 shown in FIG. 4.

In operation 1020, the receiver 200 equalizes the output signals by the DFE circuit, and generates odd data signals based on even data signals.

In operation 1030, the receiver 200 equalizes the output signals by the DFE circuit, and generates even data signals based on odd data signals.

In some embodiment, the DFE circuit indicates the non-linear equalizer circuit 240 in FIG. 2. In some embodiment, the DFE circuit indicates the circuits including the non-linear equalizer circuit 240, the clock signal generator circuit 250, and the DAC 270-2 in FIG. 2. In some embodiment, the DFE circuit indicate the odd data equalizer 610 and the even data equalizer 620 in FIG. 6.

Moreover, in some embodiments, when the receiver 200 generates the odd data signals by the DFE circuit, the receiver 200 also adds a first plurality of feedback signals to each one of the output signals by summer circuits.

In some embodiment, the first plurality of feedback signals indicate the odd data signal Sod shown in FIG. 5 or the first plurality of feedback signals H2-1~H10-1 shown in FIG. 6. In some embodiment, the summer circuit indicates one of the summer circuits 611 shown in FIG. 6 or the summer circuit 700 shown in FIG. 7.

Moreover, in some embodiments, when the receiver 200 generates the odd data signals by the DFE circuit, the receiver 200 also processes outputs of the summer circuits respectively by groups of slicer circuits.

In some embodiment, the slicer circuit indicates one of the slicer circuits 612 shown in FIG. 6 or the slicer circuit 800 shown in FIG. 8. In some embodiment, groups of slicer circuits indicate four slicer circuits connected in parallel like one block of slicer circuit 612-1 shown in FIG. 6.

Moreover, in some embodiments, when the receiver 200 generates the odd data signals by the DFE circuit, the receiver 200 also selects outputs of the groups of slicer circuits by multiplexer, and outputs the odd data signals.

In some embodiment, the multiplexer indicates one of the multiplexers 613 shown in FIG. 6.

Moreover, in some embodiments, when the receiver 200 generates the odd data signals by the DFE circuit, the receiver 200 also latches the odd data signals to generate a first feedback signal of the first plurality of feedback signals.

In some embodiment, the first feedback signal of the first plurality of feedback signals indicates one of the first plurality of feedback signals H2-1~H10-1 shown in FIG. 6, for example, the first feedback signal H2-1.

Moreover, in some embodiments, when the receiver 200 generates the odd data signals by the DFE circuit, the receiver 200 also generates at least one of a second plurality of feedback signals according to the first feedback signal. In some embodiments, when the receiver 200 generates the odd data signals by the DFE circuit, the receiver 200 also latches the at least one of the second plurality of feedback signals, to generate at least one feedback signal, other than the first feedback signal, of the first plurality of feedback signals.

In some embodiment, the second plurality of feedback signals indicate the second plurality of feedback signals H2-2~H10-2 associated with FIG. 6.

Furthermore, in some embodiments of this document, at least one of the transistors is implemented with at least one metal oxide semiconductor (MOS) transistor, at least one bipolar junction transistor (BJT), etc., or the combination thereof. Various circuits or devices to implement the transistors in the aforementioned embodiments are within the contemplated scope of the present disclosure.

In some embodiments, an integrated circuit is disclosed. The integrated circuit includes a first equalizer circuit and a second equalizer circuit. The first equalizer circuit is configured to equalize an input signal which is added by offset voltages that are different from each other, to generate output signals with voltage levels that are different from each other. The second equalizer circuit coupled to the first equalizer circuit. The second equalizer circuit includes a first equalizer unit and a second equalizer unit. The first equalizer unit is configured to equalize the output signals, to generate odd data signals. The second equalizer unit is coupled to the first equalizer unit and configured to equalize the output signals, to configured generate even data signals.

In some embodiments, the integrated circuit further includes a plurality of voltage shifting amplifier circuits, which are configured to generate the offset voltages that are programmable, and configured to add the offset voltages to the input signal.

In some embodiments, the first equalizer circuit includes a first differential amplifier, a second differential amplifier and a digital-to-analog converter. The second differential amplifier includes output terminals that are coupled to output terminals of the first differential amplifier, and includes input terminals that are configured to receive a differential control signal. The digital-to-analog converter is configured to convert a digital input signal into the differential control signal.

In some embodiments, the first equalizer circuit includes a plurality of summer circuits, a plurality of slicer circuits and a plurality of multiplexers. The plurality of summer circuits are configured to add a first plurality of feedback signals to the output signals. The plurality of slicer circuits are coupled to the plurality of summer circuits. A corresponding group of slicer circuits of the plurality of slicer circuits is configured to receive an output signal of a corresponding summer circuit of the plurality of summer circuits. The plurality of multiplexers are coupled to the plurality of slicer circuits. One of the plurality of multiplexers is configured to receive output signals of the corresponding group of slicer circuits and configured to output part of the odd data signals.

In some embodiments, the first equalizer circuit further includes a decoder and a plurality of latches. The decoder is configured to receive output signals of the plurality of multiplexers and to output binary data signals. The plurality of latches are configured to receive the binary data signals and to output a first feedback signal of the first plurality of feedback signals.

In some embodiments, the first equalizer circuit further includes a first plurality of latches. The first plurality of latches are configured to receive the odd data signals and to generate a first feedback signal of the first plurality of feedback signals. The second equalizer unit is further configured to receive the first feedback signal to generate at least one of a second plurality of feedback signals.

In some embodiments, the first equalizer circuit further includes a second plurality of latches. The second plurality of latches are configured to receive the at least one of the second plurality of feedback signals, to generate at least one feedback signal, other than the first feedback signal, of the first plurality of feedback signals.

In some embodiments, the first equalizer circuit includes a continuous time linear equalizer (CTLE) circuit, and the second equalizer circuit includes a decision feedback equalizer (DFE) circuit.

Also disclosed is an integrated circuit includes a continuous time linear equalizer (CTLE) circuit and a decision feedback equalizer (DFE) circuit. The CTLE circuit is configured to receive and shift an input signal by a positive voltage, a zero voltage, and a negative voltage, and is configured to generate output signals corresponding to the positive voltage, the zero voltage, and the negative voltage. The DFE includes a first DFE unit and a second DFE unit that are coupled to the CTLE circuit. The first DFE unit is configured to equalize the output signals and to generate odd data signals, and is configured to transmit the odd data signals to the second DFE unit for generating even data signals. The second DFE unit is configured to equalize the output signals and to generate the even data signals, and is configured to transmit the even data signals to the first DFE unit for generating the odd data signals.

In some embodiments, the first DFE unit includes a plurality of summer circuits, a plurality of groups of slicer circuits and a plurality of multiplexers. The plurality of summer circuits are configured to process the output signals, respectively, by adding a first plurality of feedback signals to each one of the output signals. The first plurality of feedback signals are generated based on the odd data signals and at least one of a second plurality of feedback signals transmitted from the second DFE unit. Each group of slicer circuits of the plurality of groups of slicer circuits are configured to receive an output signal of a corresponding summer circuit of the plurality of summer circuits. Each of the plurality of multiplexers is configured to receive output signals of a corresponding group of slicer circuits of the plurality of groups of slicer circuits and configured to output part of the odd data signals.

In some embodiments, the first DFE unit further includes a decoder. The decoder is configured to receive output signals of the plurality of multiplexers and to output binary odd data signals, and is configured to transmit the binary odd data signals to the second DFE unit. Each of the plurality of multiplexers is configured to output, in response to binary even data signals transmitted from the second DFE unit, part of the odd data signals.

In some embodiments, the first DFE unit further includes a first plurality of latches. The first plurality of latches are configured to receive the binary odd data signals and to generate a first feedback signal of the first plurality of feedback signals, and are configured to transmit the first feedback signal to the second DFE unit for generating at least one of the second plurality of feedback signals.

In some embodiments, the first DFE unit further includes a second plurality of latches. The second plurality of latches are configured to receive the at least one of the second plurality of feedback signals, to generate feedback signals, other than the first feedback signal, of the first plurality of feedback signals.

In some embodiments, at least one summer circuit of the plurality of summer circuits includes a differential input circuit and a plurality of feedback circuits. The differential input circuit is configured to receive a corresponding output signal of the output signals from the CTLE circuit, and is configured to generate output signals to a corresponding group of slicer circuits of the plurality of groups of slicer circuits. Each one of the plurality of feedback circuits is configured to receive a corresponding feedback signal of the first plurality of feedback signals, and is configured to generate output signals, which correspond to the corresponding feedback signal, to be added to the output signals of the differential input circuit.

In some embodiments, at least one summer circuit further includes a level shifting circuit and a common mode keeper circuit. The level shifting circuit is coupled to the differential input circuit and is configured to shift voltage levels of the output signals of the differential input circuit. The common mode keeper circuit is configured to keep a common mode voltage of the output signals of the differential input circuit constant.

In some embodiments, the CTLE circuit includes a plurality of voltage shifting amplifier circuits. The plurality of voltage shifting amplifier circuits are configured to shift the input signal by the positive voltage, the zero voltage, and the negative voltage, respectively. Each one of the plurality of voltage shifting amplifier circuits includes a first differential amplifier, a digital-to-analog converter and a second differential amplifier. The first differential amplifier is configured to receive the input signal, and configured to generate output signals. The digital-to-analog converter is configured to convert a digital input signal into a differential control signal. The second differential amplifier is configured to be controlled with the differential control signal, to generate output signals to be added to the output signals of the first differential amplifier, as the output signals.

Also disclosed is a method which includes the following operations. Equalizing, by a continuous time linear equalizer (CTLE) circuit, an input signal which is shifted with offset voltages that are different from each other, to generate output signals corresponding to the offset voltages. Equalizing the output signals by a decision feedback equalizer (DFE) circuit, to generate odd data signals based on even data signals. Equalizing the output signals by the DFE circuit, to generate the even data signals based on the odd data signals.

In some embodiments, the operation of equalizing the output signals by the DFE circuit to generate odd data signals includes the following operations. Adding, by summer circuits, a first plurality of feedback signals to each one of the output signals. Processing, by groups of slicer circuits, output signals of the summer circuits, respectively. Selecting, by multiplexers, output signals of the groups of slicer circuits, to output the odd data signals.

In some embodiments, the operation of equalizing the output signals by the DFE circuit to generate odd data signals further includes the following operations. Latching the odd data signals to generate a first feedback signal of the first plurality of feedback signals. Generating at least one of a second plurality of feedback signals according to the first feedback signal. Latching the at least one of the second plurality of feedback signals, to generate at least one feedback signal, other than the first feedback signal, of the first plurality of feedback signals.

In some embodiments, the method further includes the following operations. Converting a digital input signal into a differential control signal. Controlling a differential amplifier with the differential control signal, to generate one of the offset voltages to be added to the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit, comprising:
a first equalizer circuit configured to equalize an input signal which is added by offset voltages that are different from each other, to generate output signals with voltage levels that are different from each other; and
a second equalizer circuit coupled to the first equalizer circuit and comprising:
a first equalizer unit configured to equalize the output signals, to generate odd data signals; and
a second equalizer unit coupled to the first equalizer unit and configured to equalize the output signals, to generate even data signals.

2. The integrated circuit of claim 1, further comprising:
a plurality of voltage shifting amplifier circuits configured to generate the offset voltages that are programmable, and configured to add the offset voltages to the input signal.

3. The integrated circuit of claim 1, wherein the integrated circuit comprises:
a first differential amplifier;
a second differential amplifier including output terminals that are coupled to output terminals of the first differential amplifier, and including input terminals that are configured to receive a differential control signal; and
a digital-to-analog converter configured to convert a digital input signal into the differential control signal.

4. The integrated circuit of claim 1, wherein the first equalizer unit comprises:
a plurality of summer circuits configured to add a first plurality of feedback signals to the output signals;
a plurality of slicer circuits coupled to the plurality of summer circuits, wherein a corresponding group of slicer circuits of the plurality of slicer circuits is configured to receive an output signal of a corresponding summer circuit of the plurality of summer circuits; and
a plurality of multiplexers coupled to the plurality of slicer circuits, wherein one of the plurality of multiplexers is configured to receive output signals of the corresponding group of slicer circuits and configured to output part of the odd data signals.

5. The integrated circuit of claim 4, wherein the first equalizer unit further comprises:
a decoder configured to receive output signals of the plurality of multiplexers and configured to output binary data signals; and
a plurality of latches configured to receive the binary data signals and configured to output a first feedback signal of the first plurality of feedback signals.

6. The integrated circuit of claim 4, wherein the first equalizer unit further comprises:
a first plurality of latches configured to receive the odd data signals and configured to generate a first feedback signal of the first plurality of feedback signals,
wherein the second equalizer unit is further configured to receive the first feedback signal to generate at least one of a second plurality of feedback signals.

7. The integrated circuit of claim 6, wherein the first equalizer unit further comprises:
a second plurality of latches configured to receive the at least one of the second plurality of feedback signals, to generate at least one feedback signal, other than the first feedback signal, of the first plurality of feedback signals.

8. The integrated circuit of claim 1, wherein the first equalizer circuit comprises a continuous time linear equalizer (CTLE) circuit, and the second equalizer circuit comprises a decision feedback equalizer (DFE) circuit.

9. An integrated circuit, comprising:
a continuous time linear equalizer (CTLE) circuit configured to receive and shift an input signal by a positive voltage, a zero voltage, and a negative voltage, and configured to generate output signals corresponding to the positive voltage, the zero voltage, and the negative voltage; and a decision feedback equalizer (DFE) circuit comprising a first DFE unit and a second DFE unit that are coupled to the CTLE circuit,
wherein the first DFE unit is configured to equalize the output signals and configured to generate odd data signals, and configured to transmit the odd data signals to the second DFE unit for generating even data signals, and
the second DFE unit is configured to equalize the output signals and configured to generate the even data signals, and configured to transmit the even data signals to the first DFE unit for generating the odd data signals.

10. The integrated circuit of claim 9, wherein the first DFE unit comprises:
a plurality of summer circuits configured to process the output signals, respectively, by adding a first plurality of feedback signals to each one of the output signals, wherein the first plurality of feedback signals are generated based on the odd data signals and at least one of a second plurality of feedback signals transmitted from the second DFE unit;
a plurality of groups of slicer circuits, wherein each group of slicer circuits of the plurality of groups of slicer circuits are configured to receive an output signal of a corresponding summer circuit of the plurality of summer circuits; and
a plurality of multiplexers, wherein each of the plurality of multiplexers is configured to receive output signals of a corresponding group of slicer circuits of the plurality of groups of slicer circuits and configured to output part of the odd data signals.

11. The integrated circuit of claim 10, wherein the first DFE unit further comprises:
a decoder configured to receive output signals of the plurality of multiplexers and configured to output binary odd data signals, and configured to transmit the binary odd data signals to the second DFE unit,
wherein each of the plurality of multiplexers is configured to output, in response to binary even data signals transmitted from the second DFE unit, part of the odd data signals.

12. The integrated circuit of claim 11, wherein the first DFE unit further comprises:
a first plurality of latches configured to receive the binary odd data signals and configured to generate a first feedback signal of the first plurality of feedback signals, and configured to transmit the first feedback signal to the second DFE unit for generating at least one of the second plurality of feedback signals.

13. The integrated circuit of claim 12, wherein the first DFE unit further comprises:
a second plurality of latches configured to receive the at least one of the second plurality of feedback signals, to generate feedback signals, other than the first feedback signal, of the first plurality of feedback signals.

14. The integrated circuit of claim 10, wherein at least one summer circuit of the plurality of summer circuits comprises:
a differential input circuit configured to receive a corresponding output signal of the output signals from the CTLE circuit, and configured to generate output signals to a corresponding group of slicer circuits of the plurality of groups of slicer circuits; and
a plurality of feedback circuits, wherein each one of the plurality of feedback circuits is configured to receive a corresponding feedback signal of the first plurality of feedback signals, and is configured to generate output signals, which correspond to the corresponding feedback signal, to be added to the output signals of the differential input circuit.

15. The integrated circuit of claim 14, wherein the at least one summer circuit further comprises:
a level shifting circuit coupled to the differential input circuit and configured to shift voltage levels of the output signals of the differential input circuit; and
a common mode keeper circuit configured to keep a common mode voltage of the output signals of the differential input circuit constant.

16. The integrated circuit of claim 9, wherein the CTLE circuit comprises:
a plurality of voltage shifting amplifier circuits configured to shift the input signal by the positive voltage, the zero voltage, and the negative voltage, respectively,
wherein each one of the plurality of voltage shifting amplifier circuits comprises:
a first differential amplifier configured to receive the input signal and configured to generate output signals;
a digital-to-analog converter configured to convert a digital input signal into a differential control signal; and
a second differential amplifier configured to be controlled with the differential control signal, to generate output signals to be added to the output signals of the first differential amplifier, as the output signals.

17. A method, comprising:
equalizing, by a continuous time linear equalizer (CTLE) circuit, an input signal which is shifted with offset voltages that are different from each other, to generate output signals corresponding to the offset voltages;
equalizing the output signals by a decision feedback equalizer (DFE) circuit, to generate odd data signals based on even data signals; and
equalizing the output signals by the DFE circuit, to generate the even data signals based on the odd data signals.

18. The method of claim 17, wherein equalizing the output signals by the DFE circuit to generate odd data signals comprises:
adding, by summer circuits, a first plurality of feedback signals to each one of the output signals;
processing, by groups of slicer circuits, output signals of the summer circuits, respectively; and
selecting, by multiplexers, output signals of the groups of slicer circuits, to output the odd data signals.

19. The method of claim 18, wherein equalizing the output signals by the DFE circuit to generate odd data signals further comprises:
latching the odd data signals to generate a first feedback signal of the first plurality of feedback signals;
generating at least one of a second plurality of feedback signals according to the first feedback signal; and
latching the at least one of the second plurality of feedback signals, to generate at least one feedback signal, other than the first feedback signal, of the first plurality of feedback signals.

20. The method of claim 17, further comprising:
converting a digital input signal into a differential control signal; and
controlling a differential amplifier with the differential control signal, to generate one of the offset voltages to be added to the input signal.

* * * * *